US012808911B2

(12) United States Patent
Emmert et al.

(10) Patent No.: US 12,808,911 B2
(45) Date of Patent: Nov. 24, 2026

(54) SENSOR CIRCUIT HAVING A COMPENSATING RESISTOR FOR COMPENSATING A TEMPERATURE COEFFICIENT OF A BRIDGE CIRCUIT

(71) Applicant: Infineon Technologies AG, Neubiberg (DE)

(72) Inventors: Michael Emmert, Regensburg (DE); Jürgen Zimmer, Neubiberg (DE); Bernhard Endres, Nabburg (DE)

(73) Assignee: Infineon Technologies AG, Neubiberg (DE)

( * ) Notice: Subject to any disclaimer, the term of this patent is extended or adjusted under 35 U.S.C. 154(b) by 155 days.

(21) Appl. No.: 18/882,094

(22) Filed: Sep. 11, 2024

(65) Prior Publication Data

US 2025/0110160 A1 Apr. 3, 2025

(30) Foreign Application Priority Data

Sep. 29, 2023 (DE) ........................ 102023126599.7

(51) Int. Cl.
*G01R 27/26* (2006.01)

(52) U.S. Cl.
CPC ................................ *G01R 27/2629* (2013.01)

(58) Field of Classification Search
CPC .................................................. G01R 27/2629
See application file for complete search history.

(56) References Cited

U.S. PATENT DOCUMENTS

| | | | |
|---|---|---|---|
| 4,414,837 A | 11/1983 | Bice et al. | |
| 4,510,813 A * | 4/1985 | Kanazawa ............ | G01L 1/2281 73/766 |
| 6,314,815 B1 | 11/2001 | Avisse | |
| 2001/0005134 A1* | 6/2001 | Friedel .................. | G01D 3/036 324/252 |
| 2003/0107373 A1 | 6/2003 | Van Zon | |
| 2003/0117254 A1 | 6/2003 | Wan et al. | |

(Continued)

FOREIGN PATENT DOCUMENTS

| | | |
|---|---|---|
| CN | 112414594 A | 2/2021 |
| EP | 0928414 A1 | 7/1999 |

(Continued)

OTHER PUBLICATIONS

Grosz, A., et al., High Sensitivity magnetometers, Springer, 2017, pp. 235-237.

(Continued)

*Primary Examiner* — Tung X Nguyen
(74) *Attorney, Agent, or Firm* — Harrity & Harrity, LLP

(57) ABSTRACT

The present disclosure relates to a sensor circuit, including a first connection, a second connection and a bridge circuit, which is connected between the first connection and the second connection, having a plurality of bridge resistors with a respective temperature coefficient. The bridge circuit has a measurement sensitivity and a temperature coefficient of measurement sensitivity and a bridge offset with a temperature coefficient of the bridge offset. The sensor circuit further includes at least one compensating resistor, which is connected between the first connection and the second connection, with a temperature coefficient that differs from the temperature coefficient of the bridge resistors.

20 Claims, 14 Drawing Sheets

(56) References Cited

U.S. PATENT DOCUMENTS

| | | | | |
|---|---|---|---|---|
| 2014/0327437 | A1* | 11/2014 | Han | G01R 19/32 324/252 |
| 2016/0238635 | A1 | 8/2016 | Zimmer | |
| 2019/0154735 | A1 | 5/2019 | Shimizu et al. | |

FOREIGN PATENT DOCUMENTS

| | | | |
|---|---|---|---|
| EP | 2801834 | A1 | 11/2014 |
| EP | 3848675 | A1 | 7/2021 |

OTHER PUBLICATIONS

Keil, S., et al., Dehnungsmesstreifen, Springer, 2017, pp. 162-175.

* cited by examiner

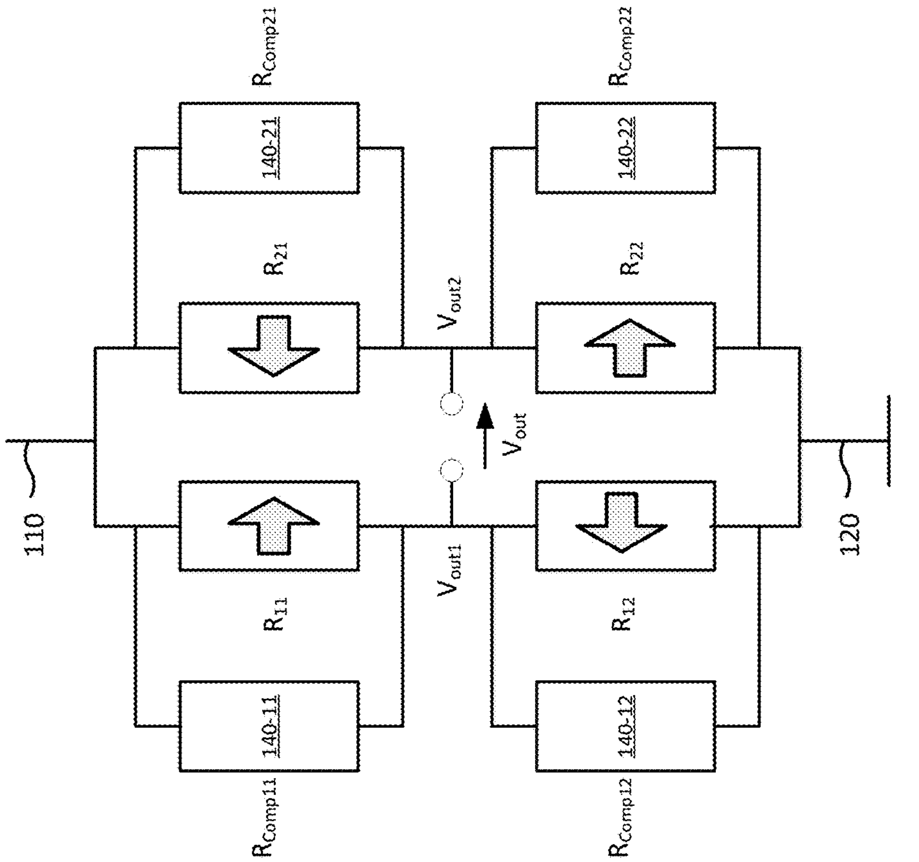
FIG. 14
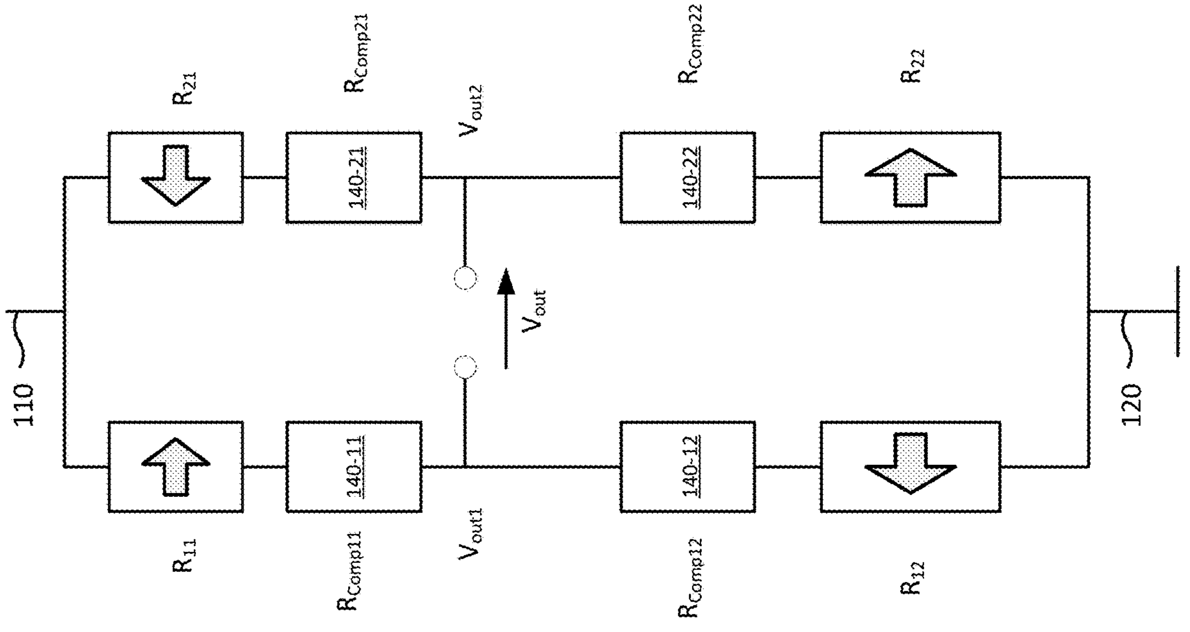

SENSOR CIRCUIT HAVING A COMPENSATING RESISTOR FOR COMPENSATING A TEMPERATURE COEFFICIENT OF A BRIDGE CIRCUIT

CROSS-REFERENCE TO RELATED APPLICATION

This application claims priority to Germany Patent Application No. 102023126599.7 filed on Sep. 29, 2023, the content of which is incorporated by reference herein in its entirety.

TECHNICAL FIELD

The present disclosure relates to sensor circuits having at least one compensating resistor for compensating temperature coefficients of a (measuring) bridge circuit.

BACKGROUND

Physical variables that are to be measured can be measured for example using measuring bridge circuits (sensor bridges). In the case of a measuring bridge circuit, half bridges and full bridges are known. A half bridge comprises two (bridge) resistors that are connected between a first connection (e.g., supply connection) and a second connection (e.g., ground connection) as voltage divider, where at least one of the resistors is dependent on a physical variable (e.g., magnetic field) that is to be measured. If the physical variable to be measured (measurement variable) changes, the voltage division ratio of the (measuring) bridge resistors also changes. A full bridge (e.g., Wheatstone bridge) comprises two half bridges that are connected in parallel between the supply connection and ground connection. Here, a differential output signal can be output between the two half bridges, depending on the measurement variable.

Measuring bridge circuits are supplied either with a constant voltage or a constant current as supply signal. In both cases, for a full bridge, the difference of the two half-bridge output voltages can generally be used as a sensor output signal. A measurement-variable-dependent (measuring) bridge resistor and its measurement sensitivity can change based on a change in temperature in accordance with the respective temperature coefficients. In the case of tunnel magnetoresistive (TMR) resistors, the temperature coefficient $TC_R$ of the bridge resistance and the temperature coefficient $TC_{SB\_TMR}$ of measurement sensitivity have a negative sign. That is to say, with increasing temperature, resistance and measurement sensitivity can decrease.

In the case of a magnetic field sensor, the measurement sensitivity $S_{B\_Br}$ of the sensor bridge (e.g., full bridge) can be defined as the change $\Delta V_{out}$ of the bridge output voltage in the event of a change $\Delta B$ of the applied magnetic field:

$$S_{B\_Br} := (\Delta V_{out})/\Delta B.$$

Instead of the magnetic field, other physical measurement variables may of course also be suitable.

The output voltage $V_{out}$ of the sensor bridge is dependent on a voltage across the entire Wheatstone bridge $V_{Br}$ however. The measurement sensitivity $S_{B0}$ of the sensor bridge is therefore proportional to $V_{Br}$:

$$S_{B0} \sim V_{Br}.$$

In the case of a negative temperature coefficient ($TC_{SB\_TMR}<0$) of measurement sensitivity of the bridge resistors, a temperature coefficient $TC_{SB\_Br}$ of measurement sensitivity of the sensor bridge also has a negative sign. In the case of a negative temperature coefficient ($TC_R<0$) of the individual bridge resistors, the total resistance of the sensor bridge between the supply connections likewise has a negative temperature coefficient $TC_{R\_Br}$.

If the sensor bridge is supplied with a constant current as supply signal, as may be necessary in certain applications, the temperature coefficient $TC_{R\_Br}$ of the total resistance of the sensor bridge influences the bridge voltage $V_{Br}$, as $$V_{Br} = R_{Br} \cdot I_{DD},$$

where $I_{DD}$ is the constant supply current.

The temperature coefficient $TC_{SB\_Br}$ of measurement sensitivity of a sensor bridge that is supplied with constant current is therefore:

$$TC_{SB0\_Br} = TC_{SB\_TMR} + TC_{R\_Br}.$$

As these two temperature coefficients are generally negative, their effects add up and the thermal characteristics of a current-fed sensor becomes poorer overall than that of a voltage-fed sensor bridge.

If an operating B-field of the sensor is not B=0 mT (e.g., when $B_{OP}$+/−$B_{Range}$ where $B_{OP}\neq 0$), the output voltage (e.g., the offset at $B=B_{OP}$) depends on the measurement sensitivity of the bridge resistors. Consequently, a change/shift of measurement sensitivity by means of the temperature (e.g., a $TC_{SB\_TMR}$) also leads directly to a temperature coefficient $TC_{Off}$ of the offset of the sensor bridge.

Therefore, there is a need for concepts for temperature compensation of measurement sensitivity and the offset voltage in sensors (e.g., magnetic field sensors) with resistance bridge circuits.

SUMMARY

This need is addressed by devices and methods of the independent patent claims. Advantageous further developments are the subject matter of the dependent patent claims.

According to a first aspect of the present disclosure, a sensor circuit is proposed. According to some example implementations, this may for example be a magnetic field sensor circuit. The sensor circuit includes a first connection (e.g., supply connection), a second connection (e.g., ground connection) and a (measuring) bridge circuit, which is connected between the first and second connection, with a measurement sensitivity (sensitivity). According to some example implementations, the bridge circuit may be a half bridge having a first and a second resistor, where at least one of the resistors is dependent on a physical variable (e.g., magnetic field) that is to be measured or may be a full bridge having two half bridges. The bridge circuit has a temperature coefficient of measurement sensitivity (measurement sensitivity temperature coefficient). The sensor circuit further includes at least one compensating resistor that is connected between the first connection (e.g., supply connection) and the second connection (e.g., ground connection), which is configured to compensate the temperature coefficient of measurement sensitivity (measurement sensitivity temperature coefficient) of the bridge circuit at least to some extent. If the bridge circuit therefore has a negative measurement sensitivity temperature coefficient, then the compensating resistor can make the measurement sensitivity temperature coefficient more positive (ideally zero). If the bridge circuit has a positive measurement sensitivity temperature coefficient, then the compensating resistor can make the measurement sensitivity temperature coefficient more negative (ideally zero).

A further aspect of the present disclosure is a sensor circuit including a first connection (e.g., supply connection) and a second connection (e.g., ground connection). The sensor circuit further includes a bridge circuit that is connected between the first connection (e.g., supply connection) and the second connection (e.g., ground connection). The bridge circuit has a plurality of bridge resistors with a respective resistor temperature coefficient. The sensor circuit additionally includes at least one compensating resistor that is connected between the first connection (e.g., supply connection) and the second connection (e.g., ground connection) with a resistance temperature coefficient that differs from the resistor temperature coefficient(s) of the bridge resistors. Due to the different temperature coefficient of the compensating resistor, temperature-induced changes of the measurement sensitivity and/or the offset of the bridge circuit can be compensated.

The compensating resistor can be connected directly or indirectly between the first connection (e.g., supply connection) and the second connection (e.g., ground connection). "Directly" means that the compensating resistor is directly connected to the first connection (e.g., supply connection) and the second connection (e.g., ground connection), for example parallel to the bridge circuit. "Indirectly" means that the compensating resistor can be connected together with other circuit components in series between the first connection (e.g., supply connection) and the second connection (e.g., ground connection). For example, the compensating resistor can be arranged in series to the bridge circuit or inside the measuring bridge circuit in series to bridge resistors.

According to some example implementations, the compensating resistor is measurement-variable-independent. The compensating resistor therefore does not change depending on the measurement variable (e.g., magnetic field).

According to some example implementations, the compensating resistor has a different (resistance) temperature coefficient than one or more bridge resistors of the bridge circuit. Due to the different (resistance) temperature coefficient, the at least partial compensation can be achieved.

According to some example implementations, the compensating resistor is connected parallel to the bridge circuit. This may for example be expedient in the case of a constant current as supply signal.

According to some example implementations, the compensating resistor or a further compensating resistor is connected inside the bridge circuit in series to the first and second resistors. This may also be expedient for example in the case of a constant current as supply signal or for compensating the temperature dependence of the offset voltage.

According to some example implementations, the compensating resistor or the further compensating resistor is connected between an output signal connection of the bridge circuit and the second connection (e.g., ground connection). In other example implementations, the compensating resistor or the further compensating resistor can also be connected between an output signal connection of the bridge circuit and the first connection (e.g., supply connection).

According to some example implementations, the temperature coefficient of measurement sensitivity (sensitivity) of the bridge circuit is negative ($TC_{SB0\_TMR}<0$), a temperature coefficient of the bridge resistors is negative ($TC_R<0$) and a temperature coefficient of the compensating resistor is positive ($TC_{R,comp}>0$).

According to some example implementations, the temperature coefficient of measurement sensitivity of the bridge circuit is positive ($TC_{SB0\_TMR}>0$), the temperature coefficient of the bridge resistors is negative ($TC_R<0$) and the temperature coefficient of the compensating resistor is more negative than the temperature coefficient of the bridge resistors ($TC_{R,comp}<TC_R$).

According to some example implementations, the temperature coefficient of measurement sensitivity of the bridge circuit is negative ($TC_{SB0\_TMR}<0$), the temperature coefficient of the bridge resistors is positive ($TC_R>0$) and the temperature coefficient of the compensating resistor is more positive than the temperature coefficient of the bridge resistors ($TC_{R,comp}>TC_R$).

According to some example implementations, the temperature coefficient of measurement sensitivity of the bridge circuit is positive ($TC_{SB0\_TMR}>0$), the temperature coefficient of the bridge resistors is positive ($TC_R>0$) and the temperature coefficient of the compensating resistor is negative ($TC_{R,comp}<0$).

According to some example implementations, the compensating resistor is connected between the first connection (e.g., supply connection) and the bridge circuit. According to other example implementations, the compensating resistor is connected between the second connection (e.g., ground connection) and the bridge circuit. This may for example be expedient in the case of a constant voltage as supply signal.

According to some example implementations, the temperature coefficient of measurement sensitivity of the bridge circuit is negative ($TC_{SB0\_TMR}<0$). The compensating resistor is measurement-variable-independent and has a smaller temperature coefficient than the temperature coefficient of the bridge resistors ($TC_{R,comp}<TC_R$).

According to some example implementations, the temperature coefficient of measurement sensitivity of the bridge circuit is positive ($TC_{SB0\_TMR}>0$). The compensating resistor is measurement-variable-independent and has a greater temperature coefficient than the temperature coefficient of the bridge resistors ($TC_{R,comp}>TC_R$).

According to some example implementations, the resistors of the bridge circuit are configured as magnetoresistive resistors. Magnetoresistance is a physical phenomenon in which the electrical resistance of a material is influenced by an external magnetic field. There are several types of magnetoresistance that can occur in various materials and applications. In the case of anisotropic magnetoresistance (AMR), the electrical resistance of a material changes depending on the direction of the external magnetic field. This phenomenon occurs in some materials that exhibit magnetic anisotropy, which means that they are preferably magnetized in a certain direction. Giant magnetoresistance (GMR) occurs in thin layer structures which consist of alternating ferromagnetic and non-magnetic layers. The resistance of these structures changes with the alignment of the magnetic regions in the layers. GMR is used in magnetoresistive sensor technology (MR sensors) and has important applications in hard disks, magnetic field sensors and data transmission technology. Colossal magnetoresistance (CMR) is a phenomenon which occurs in certain types of compounds, such as manganese oxides (manganates). At very low temperatures and in the presence of an external magnetic field, the electrical resistance of these materials can decrease dramatically. This phenomenon is being researched in materials research and potentially in the development of novel electronic components. Tunnel magnetoresistance (TMR) occurs in thin insulation layers between two ferromagnetic electrodes. The electrical resistance changes strongly if the alignment of the magnetic moments in the electrodes varies. This technology is used in the development of magnetic field sensors and non-volatile magnetic field storage devices. Extraordinary magnetoresistance (EMR) is a very rare and particular phenomenon that is observed in certain exotic materials. This is an extremely large magnetoresistive effect that has been observed in some high-energy materials. EMR has potential applications in spintronics and the development of ultrafast electronic components. The various magnetoresistances can be summarized under the term "xMR".

According to some example implementations, the resistors of the bridge circuit are configured as TMR resistors.

According to a further aspect of the present disclosure, a sensor circuit is proposed. The sensor circuit includes a constant-current source, a ground connection and a bridge circuit that is connected between the constant-current source and the ground connection, which has a negative temperature coefficient of measurement sensitivity (measurement sensitivity temperature coefficient). The bridge circuit includes at least one half bridge having a first and a second xMR resistor which in each case have a negative temperature coefficient (resistance temperature coefficient). The sensor circuit further includes at least one compensating resistor that is connected between the constant-current source and the ground connection, which essentially shows no magnetic field sensitivity (that is to say is not magnetoresistive) and has a positive temperature coefficient of resistance (resistance temperature coefficient).

According to some example implementations, the compensating resistor is connected between the constant-current source and the ground connection and parallel to the bridge circuit.

According to some example implementations, the compensating resistor or a further compensating resistor is connected in the half bridge in series to the first and second xMR resistors.

According to a further aspect of the present disclosure, a sensor circuit is proposed. The sensor circuit includes a constant-voltage source, a ground connection and a bridge circuit, which has a negative temperature coefficient of measurement sensitivity (measurement sensitivity temperature coefficient). The bridge circuit includes at least one half bridge having a first and a second xMR resistor which in each case have a negative temperature coefficient of resistance (resistance temperature coefficient). The sensor circuit further includes at least one compensating resistor, which essentially shows no magnetic field sensitivity (that is to say is not magnetoresistive) and has a negative temperature coefficient of resistance (resistance temperature coefficient). The compensating resistor is connected between the constant-voltage source and the bridge circuit and the bridge circuit is connected between the compensating resistor and the ground connection. Alternatively, the compensating resistor is connected between the bridge circuit and the ground connection and the bridge circuit is connected between the constant-voltage source and the compensating resistor.

According to some example implementations, the resistance temperature coefficient of the compensating resistor is less than the resistance temperature coefficient of the first or second xMR resistor.

According to some example implementations, a further compensating resistor is connected inside the half bridge in series to the first and second xMR resistors and the sensor circuit has a second parallel half bridge between the compensating resistor and the ground connection.

Using example implementations of the present disclosure, a measurement sensitivity temperature coefficient ($TC_{SB0\_Br}$) of a sensor bridge can be reduced in terms of absolute value. In the case of a discrete sensor bridge that is supplied with constant current, a parallel resistor, which has a resistance temperature coefficient which has an opposite sign compared to the resistance temperature coefficient of the sensor bridge, can for example trim a bridge supply voltage and make the measurement sensitivity due to temperature more stable. In the case of a discrete sensor bridge that is supplied with a constant voltage, a series resistor may have the same effect. In the case of a negative measurement sensitivity temperature coefficient of the sensor bridge ($TC_{SB0}<0$), a compensating resistor with a resistance temperature coefficient $TC_{RComp}<TC_{R\_Br}$ (resistance temperature coefficient of the sensor bridge) can be chosen. In the case of a positive measurement sensitivity temperature coefficient of the sensor bridge ($TC_{SB0}>0$), a compensating resistor with a resistance temperature coefficient $TC_{RComp}>TC_{R\_Br}$ can be chosen. In order to reduce temperature dependence of the offset voltage, resistors with defined resistance and temperature coefficients can be placed in the bridge paths.

BRIEF DESCRIPTION OF THE DRAWINGS

Some examples of devices and/or methods are explained in more detail below merely by way of example with reference to the accompanying figures. In the figures:

FIG. 14 shows further sensor circuits according to example implementations.

DETAILED DESCRIPTION

Some examples are now described in more detail with reference to the accompanying figures. Further possible examples are however not restricted to the features of these implementations that are described in detail. These may contain modifications of the features and equivalents and alternatives to the features. The terminology used herein to describe particular examples is also not intended to be restrictive for further possible examples.

The same or similar reference signs relate, throughout the description of the figures, to the same or similar elements or features, which may each be implemented identically or else in a modified form, while providing the same or a similar function. In the figures, the thicknesses of lines, layers and/or regions may also be exaggerated for clarification.

When two elements A and B are combined using an "or", this is to be understood as meaning that all possible combinations are disclosed, e.g., only A, only B, and also A and B, unless expressly defined otherwise in the individual case. "At least one of A and B" or "A and/or B" may be used as alternative wording for the same combinations. This applies equivalently to combinations of more than two elements.

If a singular form, e.g., "a, an" and "the", is used, and the use of only a single element is neither explicitly nor implicitly defined as mandatory, other examples may also use multiple elements to implement the same function. When a function is described in the following as being implemented using multiple elements, further examples may implement the same function using a single element or a single processing entity. Furthermore, it is understood that the terms "comprises", "comprising", "has" and/or "having" when used describe the presence of the indicated features, whole numbers, steps, operations, processes, elements, components and/or a group thereof, but do not thereby exclude the presence or the addition of one or more further features, whole numbers, steps, operations, processes, elements, components and/or a group thereof.

Figure 1:
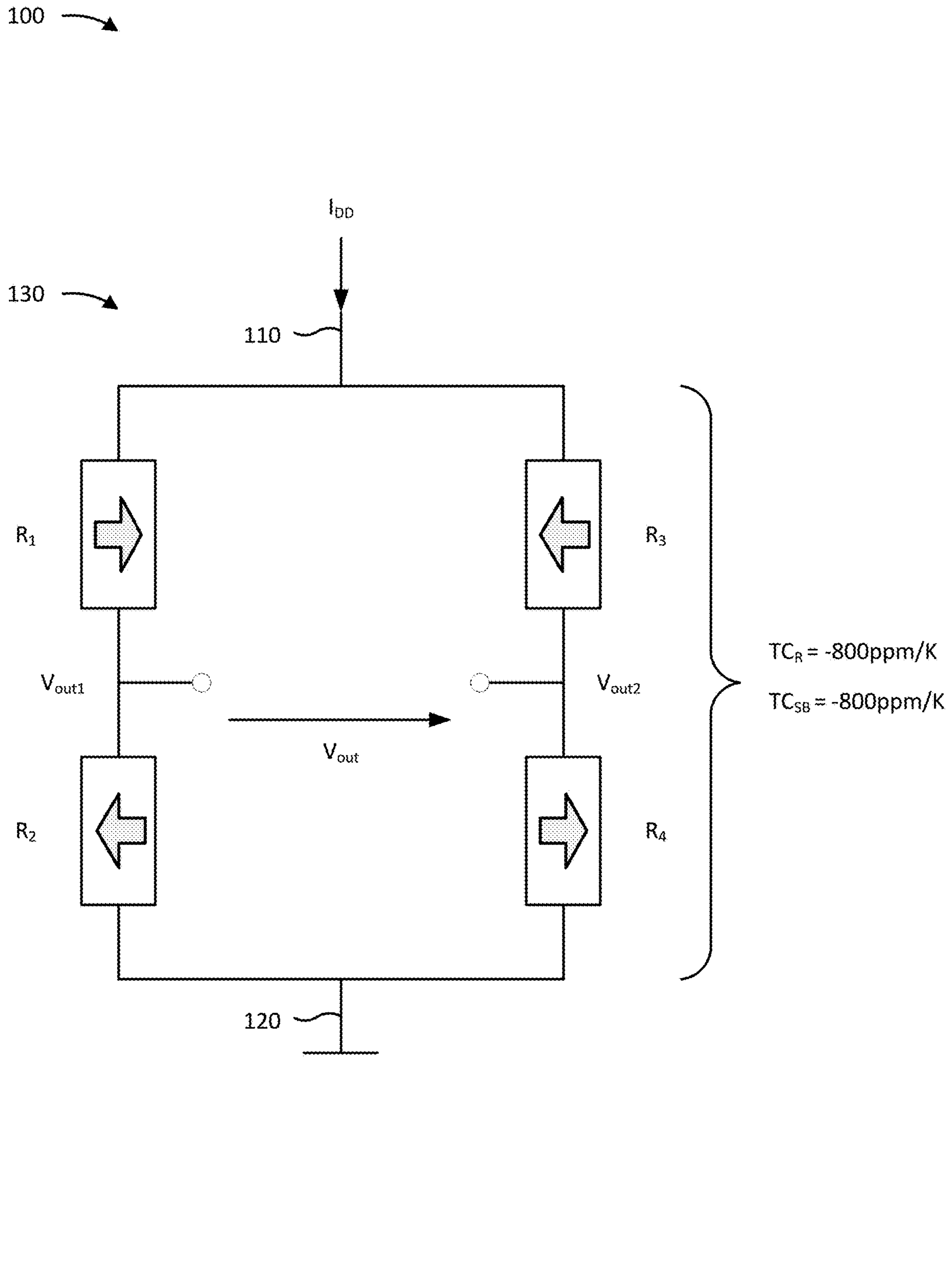
FIG. 1 shows a conventional sensor bridge circuit.

FIG. 1 shows an example of a sensor circuit 100. A physical variable can be measured using the sensor circuit 100. For example, the sensor circuit 100 may be a magnetic field sensor circuit for measuring an external magnetic field.

The sensor circuit 100 comprises a supply connection 110, a ground connection 120 and a measuring bridge circuit 130 that is connected between the supply connection 110 and the ground connection 120. The measuring bridge circuit 130 comprises a first half bridge that is connected between the supply connection 110 and the ground connection 120, having a series circuit made up of measurement-variable-dependent resistors $R_1$ and $R_2$ and, parallel thereto, a second half bridge that is connected between the supply connection 110 and the ground connection 120, having a series circuit made up of measurement-variable-dependent resistors $R_3$ and $R_4$. In the example implementation shown, the resistors $R_1$ to $R_4$ are magnetoresistive resistors, particularly TMR resistors with the different reference magnetizations of the two half bridges illustrated in FIG. 1.

A first output signal connection $V_{out1}$ is located between the resistors $R_1$ and $R_2$ of the first half bridge. A second output signal connection $V_{out2}$ is located between the resistors $R_3$ and $R_4$ of the second half bridge. A differential voltage between the two output signal connections $V_{out1}$ and $V_{out2}$ represents a measurement-variable-dependent (e.g., magnetic-field-dependent) bridge output voltage $V_{out}$ of the sensor circuit 100.

A measurement sensitivity $S_{B\_Br}$ of the measuring bridge circuit 130 can be defined as a change $\Delta V_{out}$ of the bridge output voltage $V_{out}$ in the case of a change $\Delta B$ of an applied external magnetic field (measurement variable):

$$S_{B\_Br} := (\Delta V_{out})/\Delta B$$

The bridge output voltage $V_{out}$ is dependent on a voltage $V_{Br}$ between supply connection 110 and ground connection 120 across the entire (measuring) bridge circuit 130. The measurement sensitivity $S_{B\_Br}$ of the bridge circuit 130 is therefore proportional to $V_{Br}$:

$$S_{B\_Br} \sim V_{Br}.$$

In the case of a supply with constant supply current $I_{DD}$, the voltage is $$V_{Br} = I_{DD} \cdot R_{Br},$$

where $R_{Br}$ means the total resistance of the bridge circuit 130, where $$R_{Br} = \frac{(R1 + R2) \cdot (R3 + R4)}{(R1 + R2) + (R3 + R4)}.$$

If the bridge circuit 130 is supplied with a constant current $I_{DD}$ as supply signal, as may be required in certain applications, the temperature coefficient $TC_{R\_Br}$ of the total resistance $R_{Br}$ influences the bridge voltage $V_{Br}$. The temperature coefficient $TC_{R\_Br}$ of the total resistance is in turn dependent on the temperature coefficient $TC_R$ of the individual measurement-variable-dependent bridge resistors $R_1$ to $R_4$.

In the case of a negative temperature coefficient ($TC_{SB\_TMR}<0$) of measurement sensitivity of the bridge resistors $R_1$ to $R_4$, a temperature coefficient $TC_{SB\_Br}$ of measurement sensitivity of the bridge circuit 130 also has a negative sign. In the case of a negative temperature coefficient ($TC_R<0$) of the individual bridge resistors $R_1$ to $R_4$, the total resistance $R_{Br}$ of the bridge circuit 130 between the supply connections 110, 120 likewise has a negative temperature coefficient $TC_{R\_Br}<0$.

The temperature coefficient $TC_{SB\_Br}$ of measurement sensitivity of a sensor bridge that is supplied with constant current is therefore:

$$TC_{SB\_Br} = TC_{SB\_TMR} + TC_{R\_Br}$$

As these two temperature coefficients $TC_{SB\_TMR}$ and $TC_{R\_Br}$ for TMR bridge resistors are generally negative, their effects add up and the temperature characteristics of a current-fed sensor becomes poorer overall than that of a voltage-fed sensor bridge.

Figure 2:
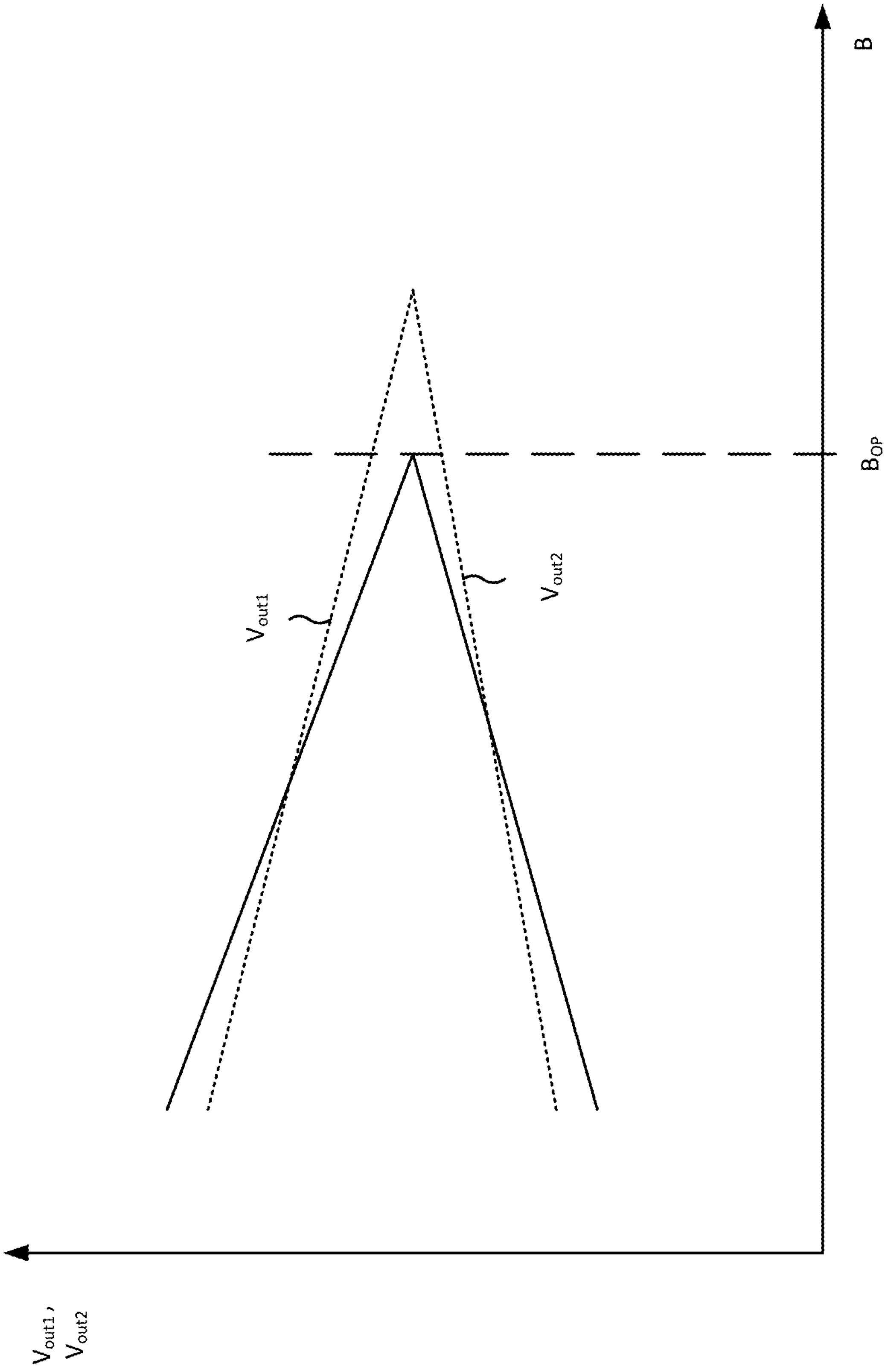
FIG. 2 shows a relationship between measurement sensitivity temperature coefficient and offset drift.

Furthermore, due to $TC_{SB\_TMR}$, a magnetic field $B_{OP}$, in which the output voltages $V_{out1}$, $V_{out2}$ of the two half bridges (with different reference magnetizations) are identical, $V_{out1}=V_{out2}$, also shifts, and therefore the differential bridge output voltage $V_{out}=0$. In the case of a change of the intrinsic measurement sensitivity ($SB_{TMR}$) of the bridge circuit, $V_{out}1=V_{out2}$ shifts to $B\neq B_{OP}$. At $B_{OP}$, a non-vanishing bridge output voltage $V_{out}\neq 0$, that is to say an offset drift, then occurs. Consequently, the temperature coefficient of measurement sensitivity $TC_{SB\_TMR}$ of the bridge circuit 130 also leads directly to a temperature coefficient of the offset $TC_{Off}$ of the bridge circuit 130. This relationship is shown in FIG. 2.

Example implementations of the present disclosure aim to compensate the temperature coefficient of measurement sensitivity $TC_{SB\_TMR}$ of the sensor bridge circuit 130 at least to some extent and therefore to obtain a sensor circuit ideally with a vanishing temperature coefficient of measurement sensitivity (at least reduced in terms of absolute value). Various example implementations are described in the following.

Figure 3:
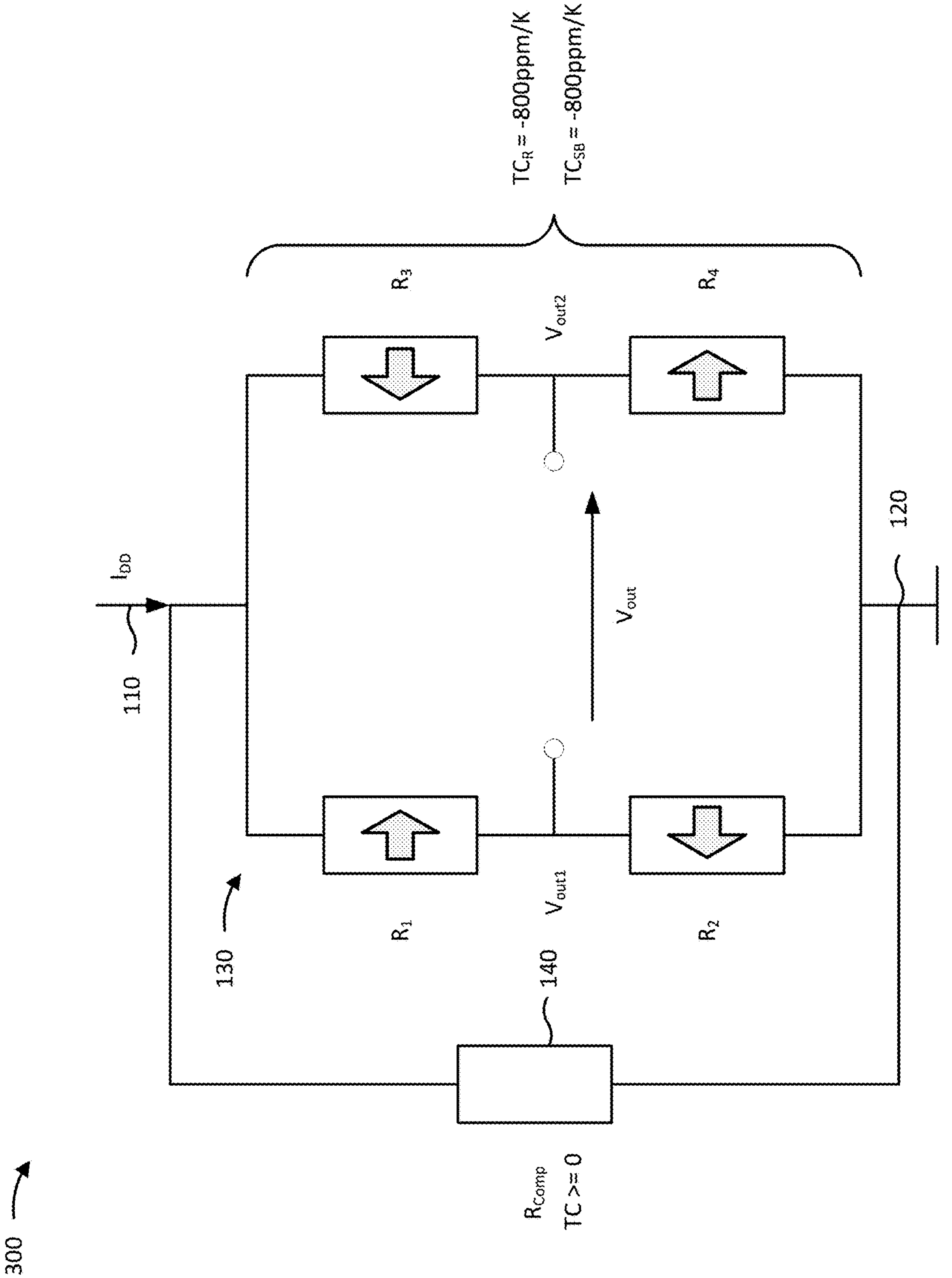
FIG. 3 shows a sensor circuit having a compensating resistor according to a first example implementation.

The sensor circuit 300 shown in FIG. 3 is fed using the supply connection 110 by a constant current $I_{DD}$ (constant-current source) and further comprises a compensating resistor 140 ($R_{comp}$) that is connected between the supply connection 110 and the ground connection 120. The compensating resistor $R_{comp}$ is configured to compensate the temperature coefficient of measurement sensitivity (measurement sensitivity temperature coefficient) $TC_{SB\_Br}$ of the bridge circuit 130 at least to some extent. To this end, the compensating resistor $R_{comp}$ is ideally measurement-variable-independent (e.g., magnetic-field-independent), that is to say in the case of magnetoresistive bridge resistors $R_1$ to $R_4$ is not magnetoresistive for example. Furthermore, the compensating resistor $R_{comp}$ has a different temperature coefficient of the compensating resistor $TC_{Rcomp}$ than the temperature coefficient $TC_R$ of the bridge resistors $R_1$ to $R_4$, e.g., $TC_{Rcomp}\neq TC_R$. Depending on the application or requirement, $TC_{Rcomp}$ can be greater or less than $TC_R$.

In the example shown, the resistance temperature coefficient $TC_R$ of the bridge resistors $R_1$ to $R_4$ is negative (here: −800 ppm/K). A negative resistance temperature coefficient $TC_{R\_Br}$ of the total resistance $R_{Br}$ of the bridge circuit 130 also results from this. Furthermore, in the example shown, the measurement sensitivity temperature coefficient $TC_{SB\_Br}$ of the bridge circuit 130 is negative ($TC_{SB\_Br}<0$).

In the sensor circuit 300 of FIG. 3, the compensating resistor $R_{comp}$ is connected between the supply signal connection 110 and the ground connection 120 and parallel to the bridge circuit 130. At a constant supply current $I_{DD}$, the voltage drop $V_{Br}$ over the bridge circuit 130 decreases with increasing temperature. If the compensating resistor $R_{comp}$ with positive resistance temperature coefficient $TC_{Rcomp}$ ($TC_{Rcomp}>0$) is chosen, the negative $TC_{R\_Br}$ of the bridge circuit 130 can be compensated at least to some extent or entirely by the parallel connection of the compensating resistor $R_{comp}$. Therefore, in a bridge circuit 130 with negative $TC_R$ Br, the compensating resistor $R_{comp}$ can be configured as a resistor with positive temperature coefficient (PTC thermistor). Therefore, the bridge voltage $V_{Br}$ and the output voltage $V_{out}$ can be stabilized over the temperature. A stabilized output voltage $V_{out}$ then in turn leads to a stabilized measurement sensitivity $S_{B\_Br}$ of the bridge circuit 130 over the temperature in accordance with $TC_{SB\_Br}=TC_{SB\_TMR}+TC_{R\_Overall}$, where $TC_{R\_Overall}$ means the resistance temperature coefficient of the parallel circuit made up of bridge circuit 130 and compensating resistor $R_{comp}$.

The compensating resistance $R_{comp}$ can according to some example implementations be chosen in an order of magnitude of the bridge resistances $R_1$ to $R_4$. If the bridge resistances $R_1$ to $R_4$ are for example 4 kΩ in each case, then the compensating resistance $R_{comp}$ can for example be chosen in a range of $1\ k\Omega<R_{comp}<10\ k\Omega$. Possible materials for the compensating resistor $R_{comp}$ are metals, PTC thermistors (PTC resistors), NTC thermistors (NTC resistors), polymer PTC thermistors, or (highly doped) polysilicon.

Figure 4:
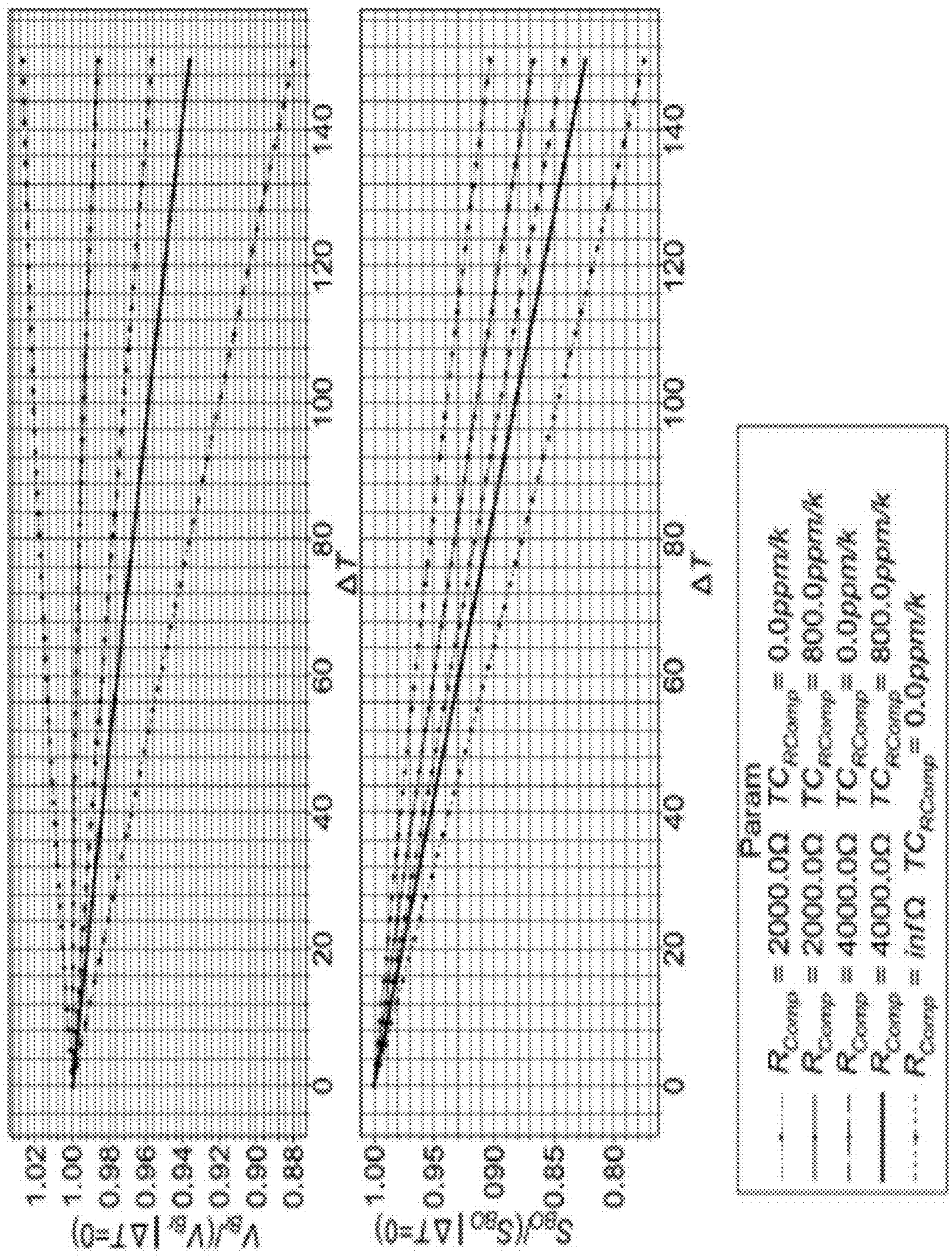
FIG. 4 shows a relationship $V_{Br}(\Delta T)/V_{Br}(\Delta T=0)$ and a relationship $S_{B0}(\Delta T)/S_{B0}(\Delta T=0)$ for various temperature differences ΔT with respect to a reference temperature and for different compensating resistors.

FIG. 4 (top) shows the resulting relationship $V_{Br}(\Delta T)/V_{Br}(\Delta T=0)$ for various temperature differences ΔT with respect to a reference temperature. FIG. 4 (bottom) shows the resulting relationship $S_{B0}(\Delta T)/S_{B0}(\Delta T=0)$ for various temperature differences ΔT. In this case, by way of example $R_1=R_2=R_3=R_4=4\ k\Omega$ was assumed. In the example shown, the best stabilization of the bridge voltage $V_{Br}$ and the measurement sensitivity of the sensor bridge was achieved for $R_{comp}=2\ k\Omega$ and $TC_{Rcomp}=+800$ ppm/K. Even for $TC_{Rcomp}=0$, better stabilizations were achieved for $R_{comp}=2\ k\Omega$ and $R_{comp}=4\ k\Omega$ than without a compensating resistor $R_{comp}$. Example implementations are therefore also conceivable, in which $TC_{Rcomp}<0$, but $TC_{Rcomp}>TC_R$, for which the resistance temperature coefficient $TC_R$ of the bridge resistors $R_1$ to $R_4$ is therefore negative ($TC_R<0$), the measurement sensitivity temperature coefficient of the bridge circuit 130 is negative ($TC_{SB\_Br}<0$) and the resistance temperature coefficient of the compensating resistor is negative ($TC_{Rcomp}<0$), but greater than $TC_R$ ($TC_{Rcomp}>TC_R$).

Figure 5:
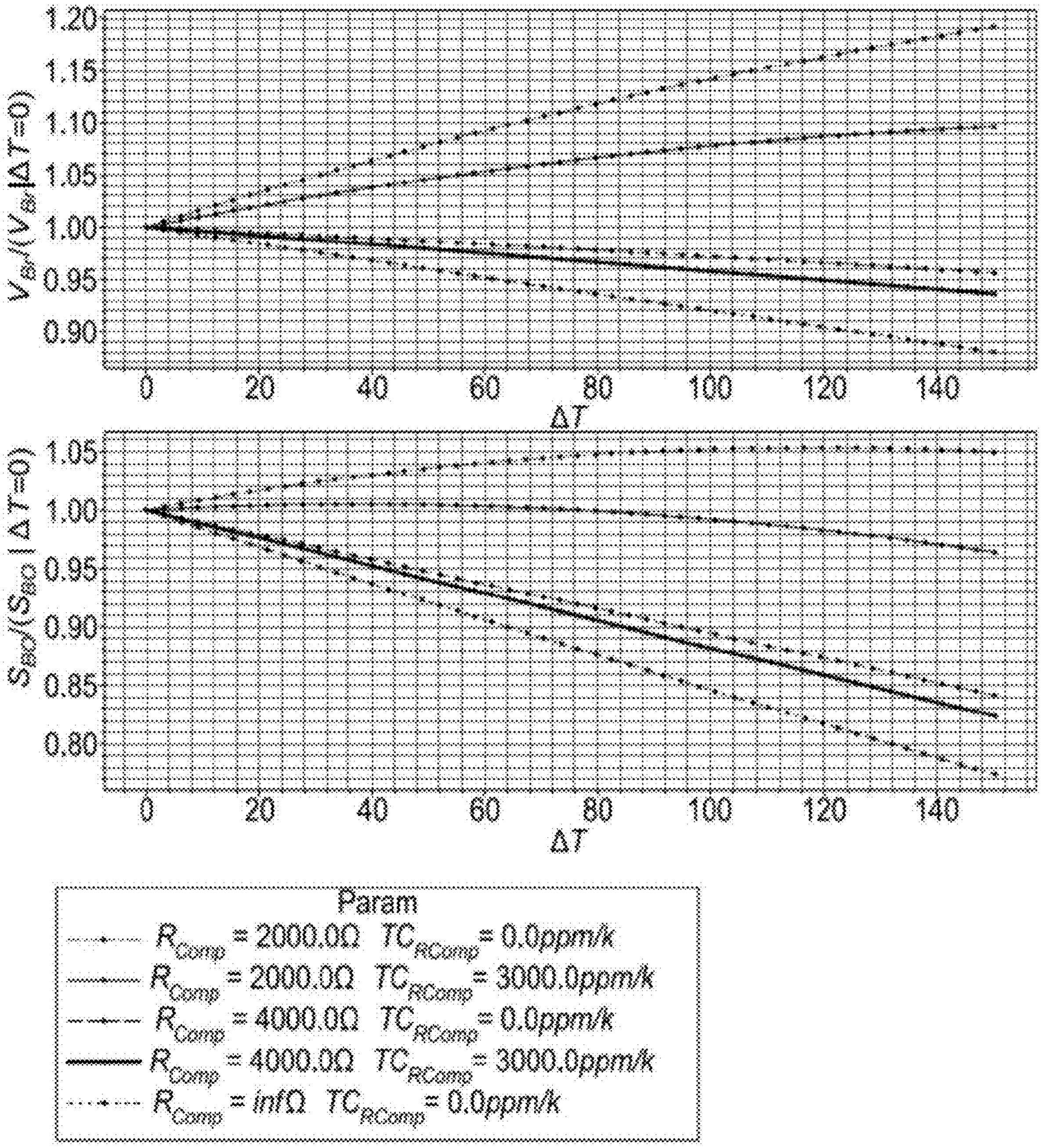
FIG. 5 shows a relationship $V_{Br}(\Delta T)/V_{Br}(\Delta T=0)$ and a relationship $S_{B0}(\Delta T)/S_{B0}(\Delta T=0)$ for various temperature differences ΔT with respect to a reference temperature and for different compensating resistors.

FIG. 5 shows similar curves to FIG. 4 for $R_{comp}=2\ k\Omega$ or 4 kΩ and $TC_{Rcomp}=0$ ppm/K or $TC_{Rcomp}=+3000$ ppm/K.

In the case of measurement-variable-dependent bridge resistors $R_1$ to $R_4$ with in each case a positive resistance temperature coefficient $TC_R$, example implementations of the sensor circuit 300 are also conceivable, in which the resistance temperature coefficient $TC_R$ of the bridge resistors $R_1$ to $R_4$ is positive ($TC_R>0$), the measurement sensitivity temperature coefficient of the bridge circuit 130 is positive ($TC_{SB\_Br}>0$) and the resistance temperature coefficient of the compensating resistor is negative ($TC_{Rcomp}<0$). Furthermore, example implementations are conceivable, in which the resistance temperature coefficient $TC_R$ of the bridge resistors $R_1$ to $R_4$ is positive ($TC_R>0$), the measurement sensitivity temperature coefficient of the bridge circuit 130 is positive ($TC_{SB\_Br}>0$) and the resistance temperature coefficient of the compensating resistor is positive ($TC_{Rcomp}>0$), but less than $TC_R$ ($TC_{Rcomp}<TC_R$ 0).

Furthermore, example implementations of the sensor circuit 300 are also conceivable, in which the measurement sensitivity temperature coefficient of the bridge circuit 130 is positive ($TC_{SB\_Br}>0$), the resistance temperature coefficient $TC_R$ of the bridge resistors $R_1$ to $R_4$ is negative ($TC_R<0$) and the resistance temperature coefficient of the compensating resistor is less than the resistance temperature coefficient of the bridge resistors ($TC_{Rcomp}<TC_R$). Furthermore, example implementations are conceivable, in which the measurement sensitivity temperature coefficient of the bridge circuit is negative ($TC_{SB\_Br}<0$), the resistance temperature coefficient of the bridge resistors is positive ($TC_R>0$) and the resistance temperature coefficient of the compensating resistor is greater than the resistance temperature coefficient of the bridge resistors ($TC_{Rcomp}>TC_R$).

In a sensor bridge circuit 130 that is fed by a constant current $I_{DD}$, an additional resistor $R_{comp}$ can therefore be connected parallel to the sensor bridge circuit 130. The constant supply current $I_{DD}$ is divided between the additional compensating resistor $R_{comp}$ and the sensor bridge circuit 130. If the temperature coefficient $TC_{Rcomp}$ of the compensating resistor is greater than the temperature coefficient $TC_{R\_Br}$ of the total bridge resistance, the temperature coefficient of the complete circuit 300 is greater than without compensating resistor $R_{comp}$, which leads to a more stable bridge voltage $V_{out}$ over the temperature. Using a large positive $TC_{Rcomp}$ of the compensating resistor $R_{comp}$, a positive temperature coefficient can also be achieved for the total system resistance, which leads to an increasing bridge voltage over the temperature. This can be used to compensate the negative temperature coefficient of measurement sensitivity that is to be observed in the case of constant bridge voltage.

In some implementations, the compensating resistor $R_{comp}$ may comprise a component (or a group of components) that provide a change of resistance in a manner similar to that described above with respect to FIGS. 1-5. In some implementations, the compensating resistor $R_{comp}$ may comprise a non-ohmic component.

Figure 6:
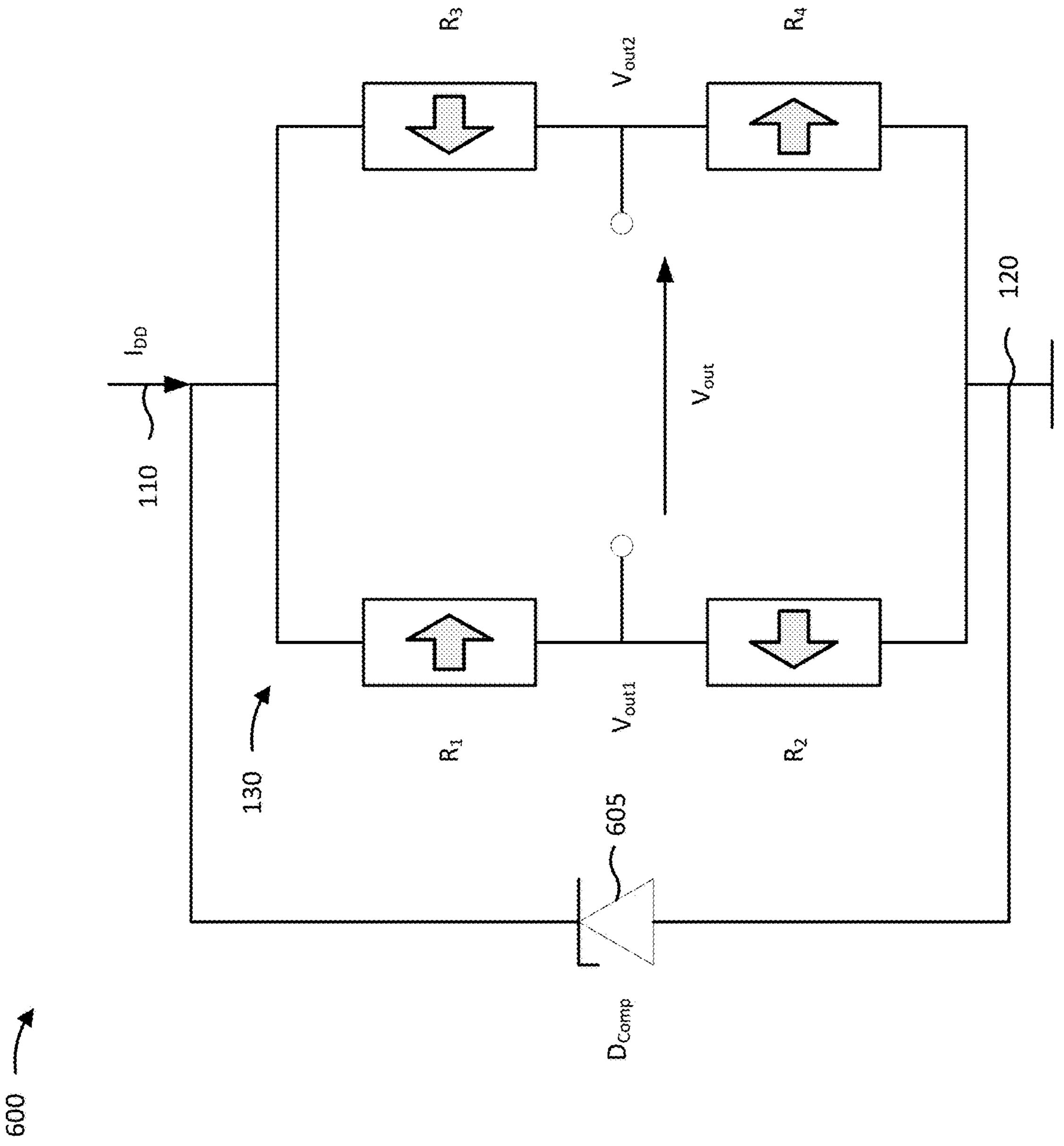
FIG. 6 shows a sensor circuit having a compensating diode according to a further example implementation.

The sensor circuit 600 shown in FIG. 6 is fed using the supply connection 110 by a constant current $I_{DD}$ (constant-current source) and further comprises a compensating diode 605 ($D_{comp}$) that is connected between the supply connection 110 and the ground connection 120. The compensating diode $D_{comp}$ is configured to compensate the temperature coefficient of measurement sensitivity (measurement sensitivity temperature coefficient) $TC_{SB\_Br}$ of the bridge circuit 130 at least to some extent. To this end, the compensating diode $D_{comp}$ is ideally measurement-variable-independent (e.g., magnetic-field-independent), that is to say in the case of magnetoresistive bridge resistors $R_1$ to $R_4$ is not magnetoresistive for example. Furthermore, the compensating diode $D_{comp}$ has a different temperature coefficient of the compensating diode $TC_{Dcomp}$ than the temperature coefficient $TC_R$ of the bridge resistors $R_1$ to $R_4$, e.g., $TC_{Dcomp} \neq TC_R$. Depending on the application or requirement, $TC_{Dcomp}$ can be greater or less than $TC_R$.

Figure 7:
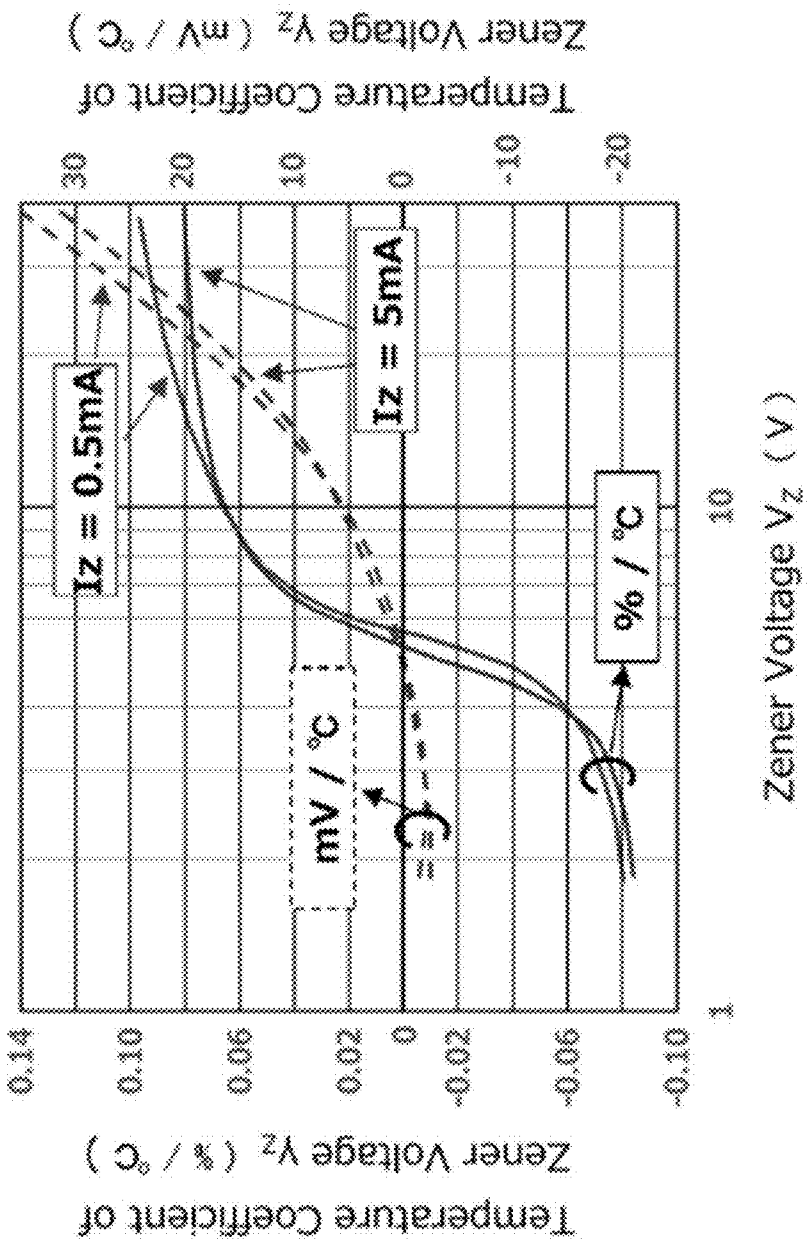
FIG. 7 shows relationships of temperature coefficient of Zener voltage for various temperature differences (%/° C.) and (mV/° C.)

FIG. 7 (left) shows the resulting relationships of temperature coefficient of Zener voltages $Y_z$ for various temperature differences (%/° C.). FIG. 7 (right) shows the resulting relationships of temperature coefficient of Zener voltages $Y_z$ for various temperature differences (mV/° C.).

Figure 8:
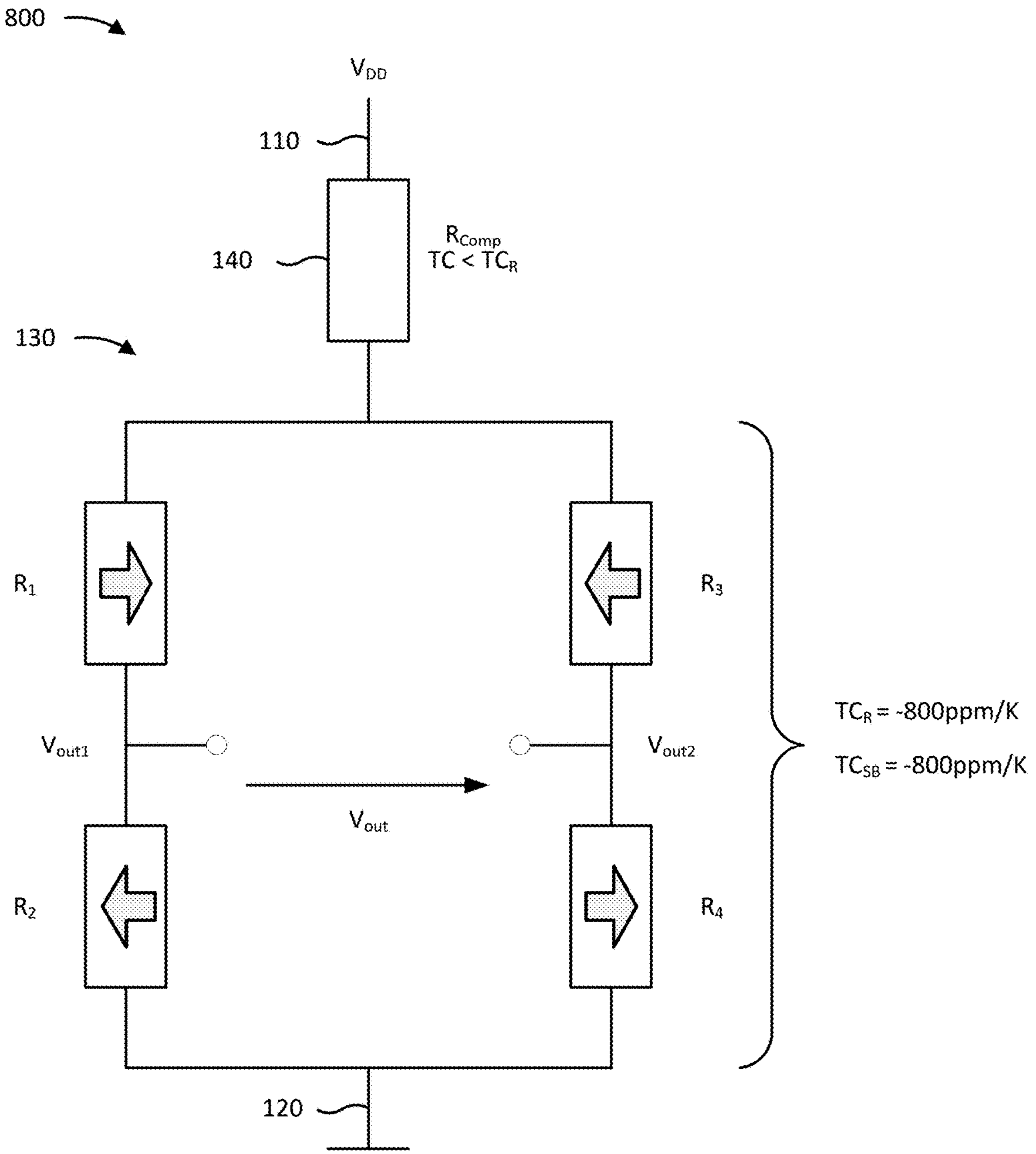
FIG. 8 shows a sensor circuit having a compensating resistor according to a further example implementation.

The sensor circuit 800 shown in FIG. 8 is fed by a constant supply voltage $V_{DD}$ (constant-voltage source) and comprises a compensating resistor 140 ($R_{comp}$) that is connected between the supply connection 110 and the bridge circuit 130. The compensating resistor $R_{comp}$ is therefore also connected between supply connection 110 and ground connection 120 here—but as a series resistor instead of as a parallel resistor. The compensating resistor $R_{comp}$ is also configured here to compensate the temperature coefficient of measurement sensitivity (measurement sensitivity temperature coefficient) $TC_{SB\_Br}$ of the bridge circuit 130 at least to some extent. To this end, the compensating resistor $R_{comp}$ is ideally measurement-variable-independent (e.g., magnetic-field-independent), that is to say for example not magnetoresistive. Furthermore, compensating resistor $R_{comp}$ has a different temperature coefficient of the compensating resistor $TC_{Rcomp}$ than the temperature coefficient $TC_R$ of the bridge resistors $R_1$ to $R_4$, e.g., $TC_{Rcomp} \neq TC_R$.

In the example shown in FIG. 8, the resistance temperature coefficient $TC_R$ of the bridge resistors $R_1$ to $R_4$ is negative (here: −800 ppm/K). A negative resistance temperature coefficient $TC_{R\_Br}$ of the total resistance $R_{Br}$ of the bridge circuit 130 also results from this. Furthermore, in the example shown, the measurement sensitivity temperature coefficient $TC_{SB\_Br}$ of the bridge circuit 130 is likewise negative ($TC_{SB\_Br}<0$).

Figure 9:
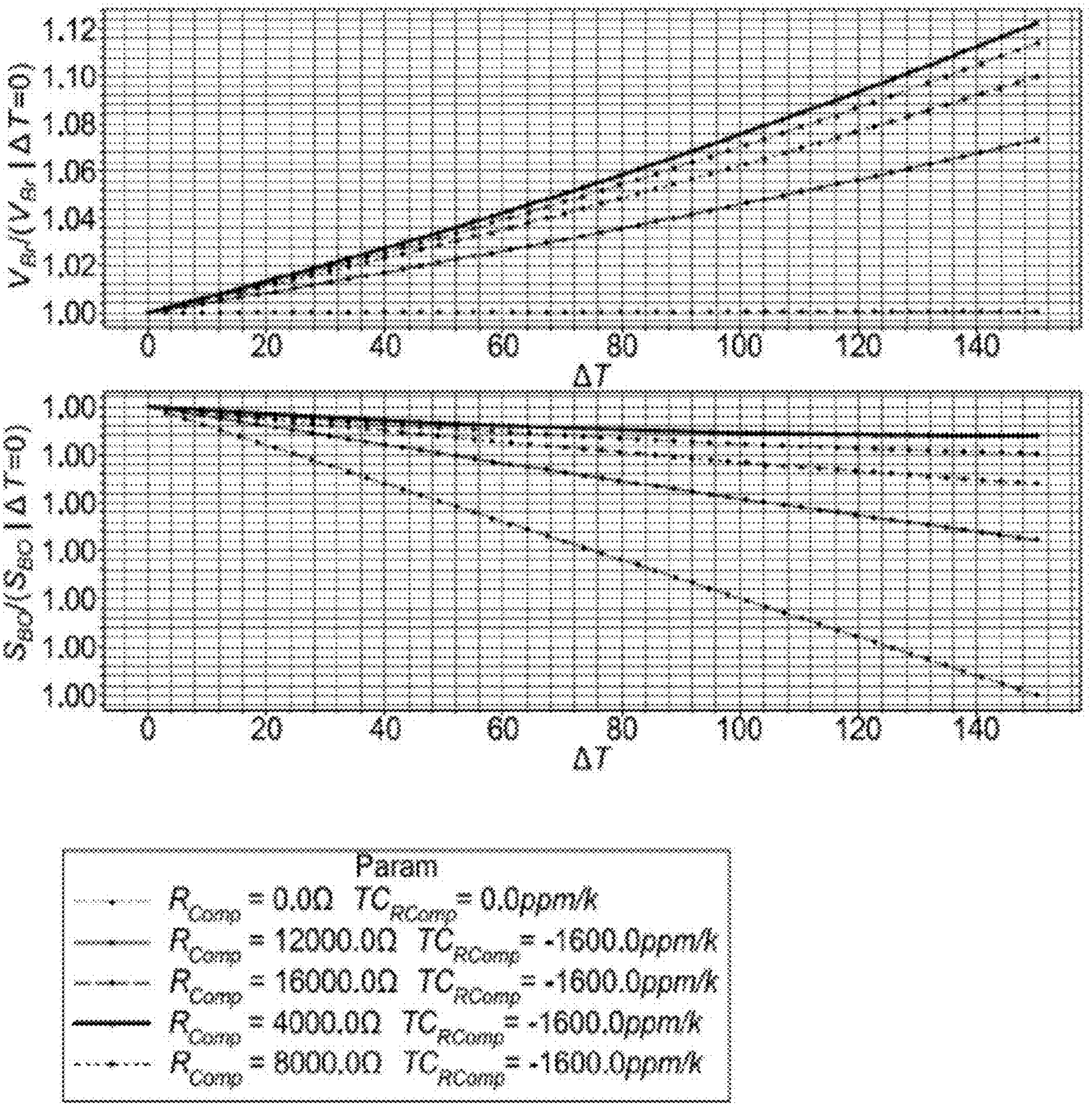
FIG. 9 shows a relationship $V_{Br}(\Delta T)/V_{Br}(\Delta T=0)$ and a relationship $S_{B0}(\Delta T)/S_{B0}(\Delta T=0)$ for various temperature differences ΔT with respect to a reference temperature and for different compensating resistors.

In the sensor circuit 800 of FIG. 8, the measurement-variable-independent compensating resistor $R_{comp}$ is connected between the supply signal connection 110 and the bridge circuit 130 and has a resistance temperature coefficient $TC_{Rcomp}$ which is smaller (more negative) than the resistance temperature coefficient $TC_R$ of the bridge resistors $R_1$ to $R_4$ ($TC_{Rcomp}<TC_R$). According to FIG. 8, the measurement sensitivity temperature coefficient $TC_{SB\_Br}$ of the bridge circuit 130 is therefore negative, the compensating resistor is essentially measurement-variable-independent and has a smaller resistance temperature coefficient $TC_{Rcomp}$ than the resistance temperature coefficient $TC_R$ of the bridge resistors. As a result, at a constant supply voltage $V_{DD}$, the voltage drop because of the compensating resistor $R_{comp}$ is stronger than the voltage drop because of the bridge circuit 130. At a constant supply voltage $V_{DD}$, the voltage drop $V_{Br}$ because of the bridge circuit 130 therefore increases with increasing temperature. This is shown in FIG. 9 (top), which shows the resulting relationship $V_{Br}(\Delta T)/V_{Br}(\Delta T=0)$ for various temperature differences ΔT. FIG. 9 (bottom) shows the resulting measurement sensitivity relationship $S_{B0}(\Delta T)/S_{B0}(\Delta T=0)$ for various temperature differences ΔT. The different curves of FIG. 7 relate to different $R_{comp}$ of 0 kΩ to 8 kΩ and $TC_{Rcomp}=0$ ppm/K or $TC_{Rcomp}=-1600$ ppm/K.

If the compensating resistor $R_{comp}$ with resistance temperature coefficient $TC_{Rcomp}<TC_R$ is chosen, the negative $TC_{R\_Br}$ of the bridge circuit 130 can be compensated at least to some extent or entirely. Due to the bridge voltage $V_{Br}$ increasing with ΔT>0, the output voltage $V_{out}$ can be stabilized over the temperature in spite of falling bridge resistances $R_1$ to $R_4$. A stabilized output voltage $V_{out}$ then in turn leads to a stabilized measurement sensitivity $S_{B\_Br}$ of the bridge circuit 130 over the temperature (see FIG. 9 (bottom)).

In the case of measurement-variable-dependent bridge resistors $R_1$-$R_4$ in each case with a positive resistance temperature coefficient $TC_R$, example implementations of the sensor circuit 800 are also conceivable, in which the measurement sensitivity temperature coefficient $TC_{SB\_Br}$ of the bridge circuit 130 is positive ($TC_{SB\_Br}>0$), the compensating resistor $R_{comp}$ is measurement-variable-independent and has a greater resistance temperature coefficient $TC_{Rcomp}$ than the resistance temperature coefficient $TC_R$ of the bridge resistors ($TC_{Rcomp}>TC_R$).

If the bridge 130 is supplied with a constant supply voltage $V_{DD}$, a series compensating resistor $R_{comp}$ with defined temperature coefficient $TC_{Rcomp}$ can be used to trim the bridge voltage $V_{Br}$. With suitable values for resistance $R_{comp}$ and temperature coefficient $TC_{Rcomp}$, this series resistor can compensate the temperature coefficient of sensitivity $TC_{SB\_TMR}$.

Figure 10:
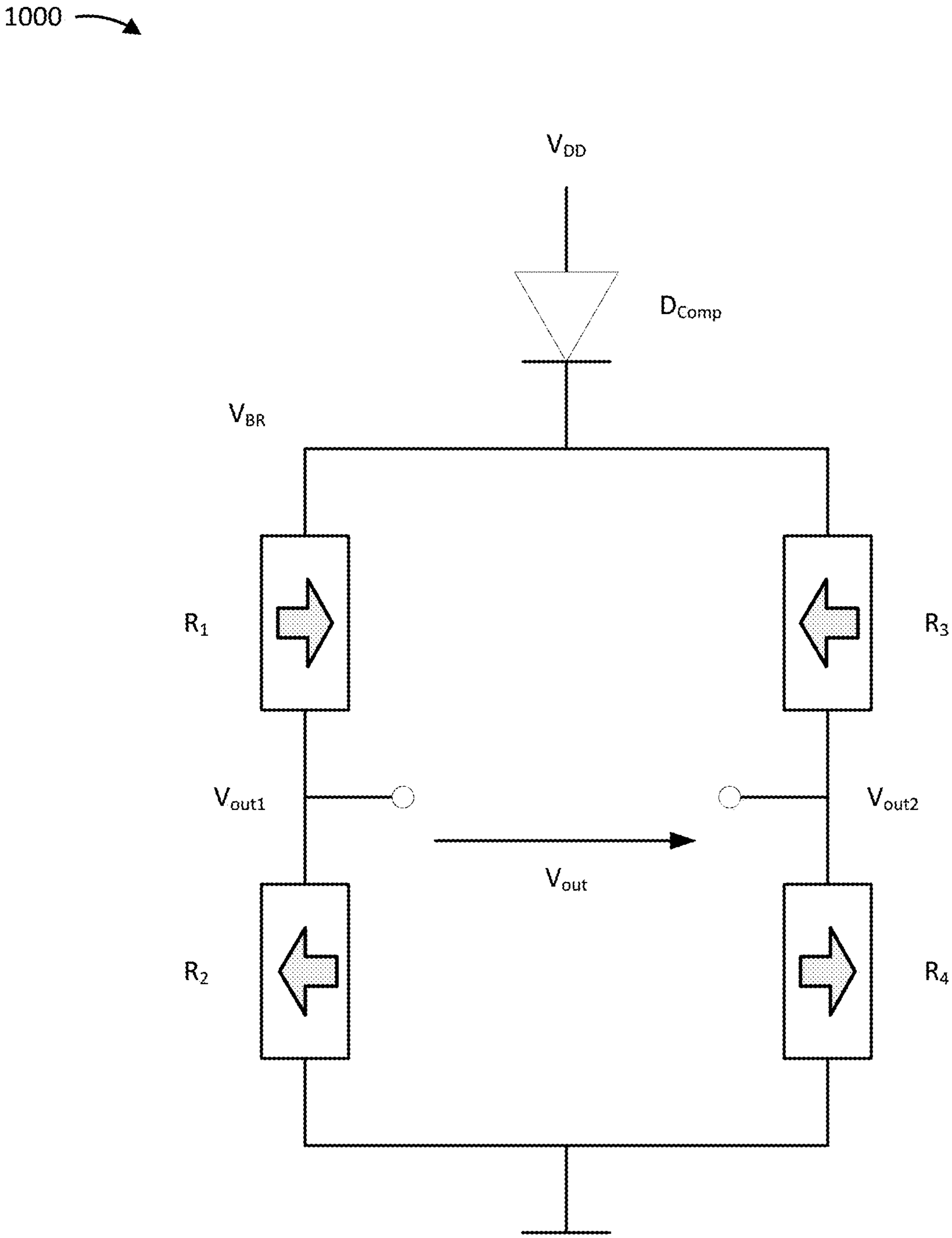
FIG. 10 shows a sensor circuit having a compensating diode according to a further example implementation.

In the sensor circuit 1000 of FIG. 10, the measurement-variable-independent compensating diode $D_{comp}$ is connected between the supply signal connection 110 and the bridge circuit 130 and has a resistance temperature coefficient $TC_{Dcomp}$ which is smaller (more negative) than the resistance temperature coefficient $TC_R$ of the bridge resistors $R_1$ to $R_4$ ($TC_{Dcomp}<TC_R$). According to FIG. 10, the measurement sensitivity temperature coefficient $TC_{SB\_Br}$ of the bridge circuit 130 is therefore negative, the compensating diode $D_{comp}$ is essentially measurement-variable-independent and has a smaller resistance temperature coefficient $TC_{Dcomp}$ than the resistance temperature coefficient $TC_R$ of the bridge resistors. As a result, at a constant supply voltage $V_{DD}$, the voltage drop because of the compensating diode $D_{comp}$ is stronger than the voltage drop because of the bridge circuit 130. At a constant supply voltage $V_{DD}$, the voltage drop $V_{Br}$ because of the bridge circuit 130 therefore increases with increasing temperature.

Figure 11:
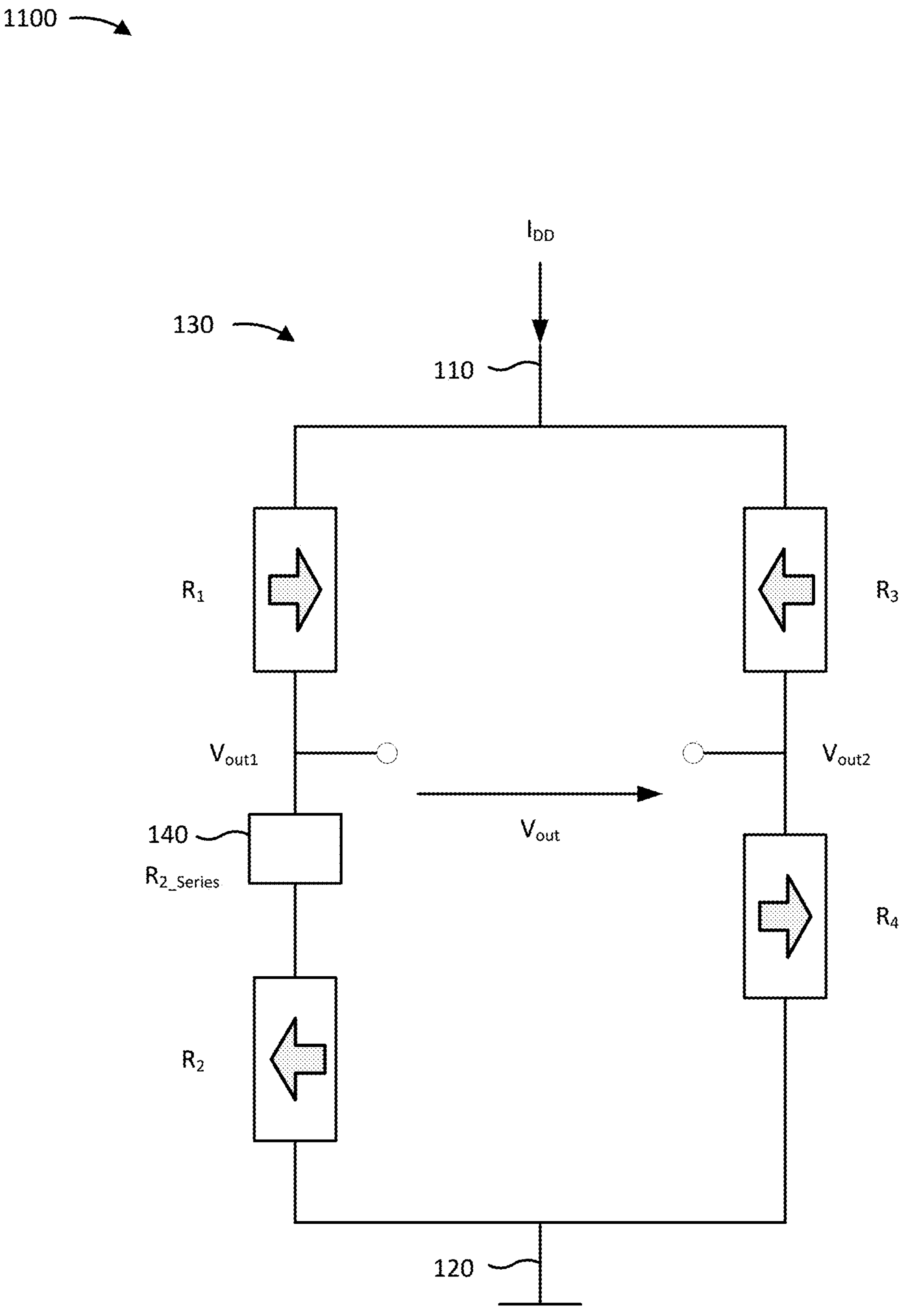
FIG. 11 shows a sensor circuit having a compensating resistor according to a further example implementation.

The sensor circuit 1100 shown in FIG. 11 is fed at the supply connection 110 by a constant supply current $I_{DD}$ and comprises a compensating resistor 140 ($R_{2,series}$) that is connected in series in the first half bridge $R_1$, $R_2$. The compensating resistor $R_{2,series}$ is therefore connected in the bridge circuit 130 in series to the first resistor $R_1$ and the second resistor $R_2$. In the example shown, the compensating resistor $R_{2,series}$ is connected between the first output signal connection $V_{out1}$ and the bridge resistor $R_2$. Different arrangements of the compensating resistor inside the first half bridge are likewise conceivable. Likewise, the compensating resistor $R_{2,series}$ can be arranged in the second half bridge $R_3$, $R_4$.

The compensating resistor $R_{2,series}$ is therefore also connected here between supply connection 110 and ground connection 120. Furthermore, the compensating resistor $R_{2,series}$ is also configured here to compensate the measurement sensitivity temperature coefficient $TC_{SB\_Br}$ of the bridge circuit 130 at least to some extent. To this end, the compensating resistor $R_{2,series}$ is ideally measurement-variable-independent (e.g., magnetic-field-independent), that is to say not magnetoresistive for example. Furthermore, the compensating resistor $R_{2,series}$ has a different temperature coefficient $TC_{R2\_series}$ than the temperature coefficient $TC_R$ of the bridge resistors $R_1$ to $R_4$, e.g., $TC_{R2\_series}$ #$TC_R$.

In some implementations, the compensating resistor $R_{2,series}$ may comprise a component (or a group of components) that provide a change of resistance in a manner similar to that described above. In some implementations, the compensating resistor $R_{2,series}$ may comprise a non-ohmic component.

Figure 12:
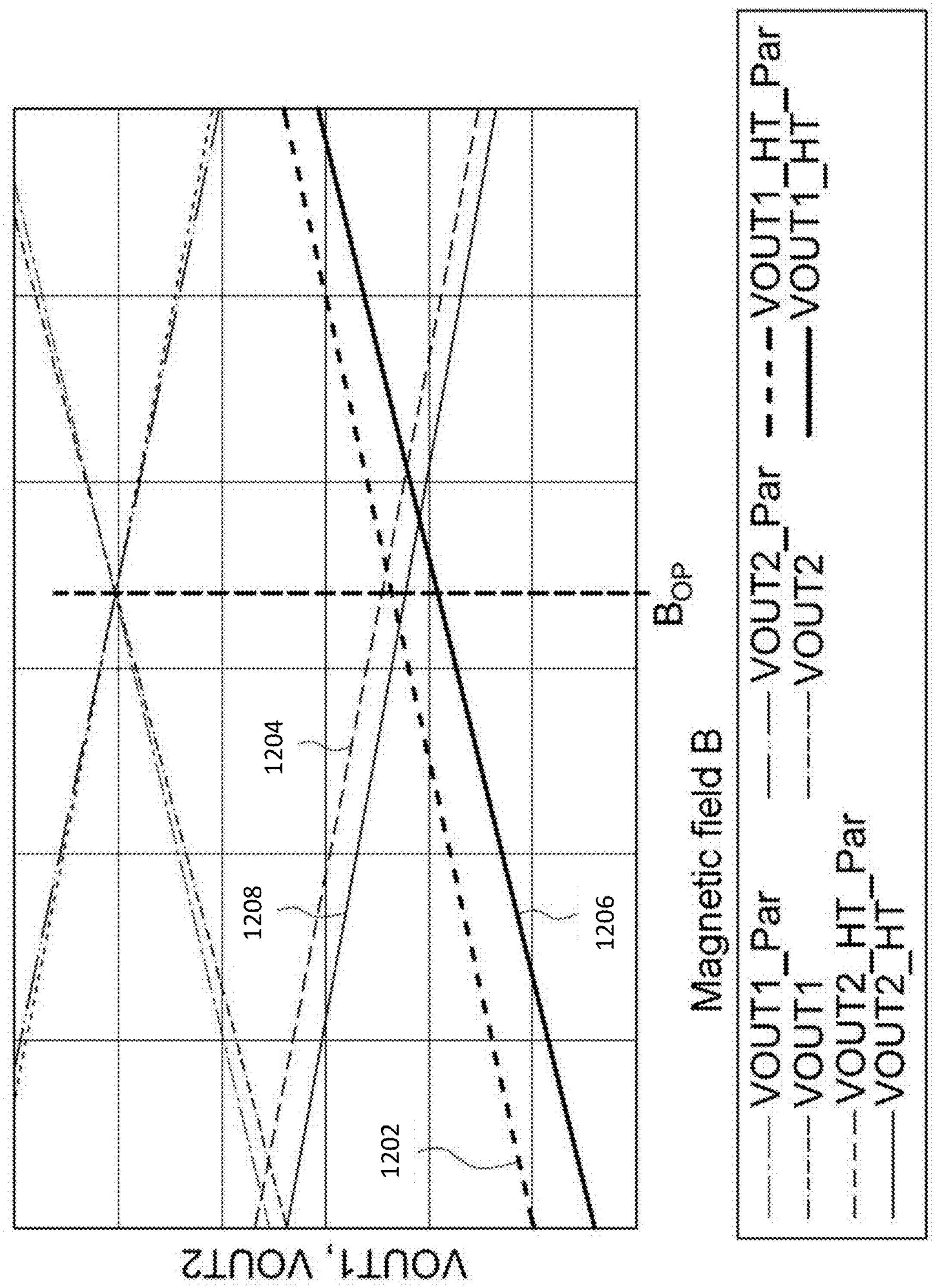
FIG. 12 shows effects of the compensating resistor according to FIG. 11 on an output voltage offset.

In FIG. 12, the output voltages $V_{out1}$, $V_{out2}$ of the half-bridge branches are illustrated depending on the B-field for the two cases with and without the additional compensating resistor $R_{2,series}$. At room temperature (thin lines), $V_{out1}$ and $V_{out2}$ are identical at $B=B_{OP}$, e.g., the bridge offset is equal to zero. For the case with the additional compensating resistor $R_{2,series}$, the measurement-variable-dependent bridge resistor $R_2$ must be adjusted in order to have offset=0 at $B=B_{OP}$. The thick curves correspond to the output voltages $V_{out1}$, $V_{out2}$ at high temperature (HT). With a negative temperature coefficient of the bridge resistors, the total bridge resistance drops and the bridge voltage likewise drops at a constant supply current. Consequently, the output voltages $V_{out1}$ and $V_{out2}$ are reduced. A typically negative TC of sensitivity $TC_{SB\_TMR}$ leads to a flatter $V_{OUT}$ vs. B-characteristics, which leads to a shift of the zero offset B-field to higher values. Consequently, the bridge offset at $B_{OP}$ is no longer zero, e.g., there is a $TC_{Off}$ originating from $TC_{SB\_TMR}$. The straight, bold lines designate the $V_{OUT1/2}$ for the case without the additional compensating resistor $R_{2,series}$.

If an additional compensating resistor $R_{2,series}$ with a positive resistance temperature coefficient $TC_{R2,series}$ is connected in series to the bridge resistor $R_2$, the decrease of the total resistance of the bridge 130 and therefore also the decrease of $V_{out1/2}$ lessens at higher temperatures, as can be seen in FIG. 11 (dashed bold lines). Furthermore, the resistance of the half bridge, in which the additional compensating resistor $R_{2,series}$ is located, has a smaller decrease of $V_{OUT1}$ (line 1202) than the other half bridge $V_{OUT2}$ (line 1204). The consequence of this is that the B-field in which $V_{out1}$ and $V_{out2}$ intersect is not so strongly shifted to higher values as without the additional compensating resistor $R_{2,series}$ (lines 1206, 1208). Consequently, the offset shift due to temperature and therefore also the $TC_{Off}$ is reduced. It can therefore be seen from FIG. 12 that the additional compensating resistor $R_{2,series}$ compensates the effect of the $TC_{SB\_TMR}$ (to some extent). It is also possible to undertake overcompensation in order to achieve a change of sign of the $TC_{Off}$, in that one correspondingly chooses the additional compensating resistor $R_{2,series}$ and its temperature coefficient.

The same effect could be achieved in that instead of the additional compensating resistor $R_{2,series}$, an additional compensating resistor $R_{1,series}$ is connected in series to the bridge resistor $R_1$, which then has a negative resistance temperature coefficient however. Alternatively, an additional compensating resistor $R_{3,series}$ with a positive resistance temperature coefficient could also be connected in series to $R_3$. Then, the drop of $V_{OUT2}$ would be increased at higher temperatures, which leads to a smaller shift of the offset and therefore to a smaller $TC_{Off}$.

Generally, the proposed principle also works for the case that the bridge 130 is supplied with a constant supply voltage $V_{DD}$ or that the $TC_{SB\_TMR}$ is positive. In the latter case, the resistance temperature coefficient of the implemented series resistor must also have the opposite sign.

Figure 13:
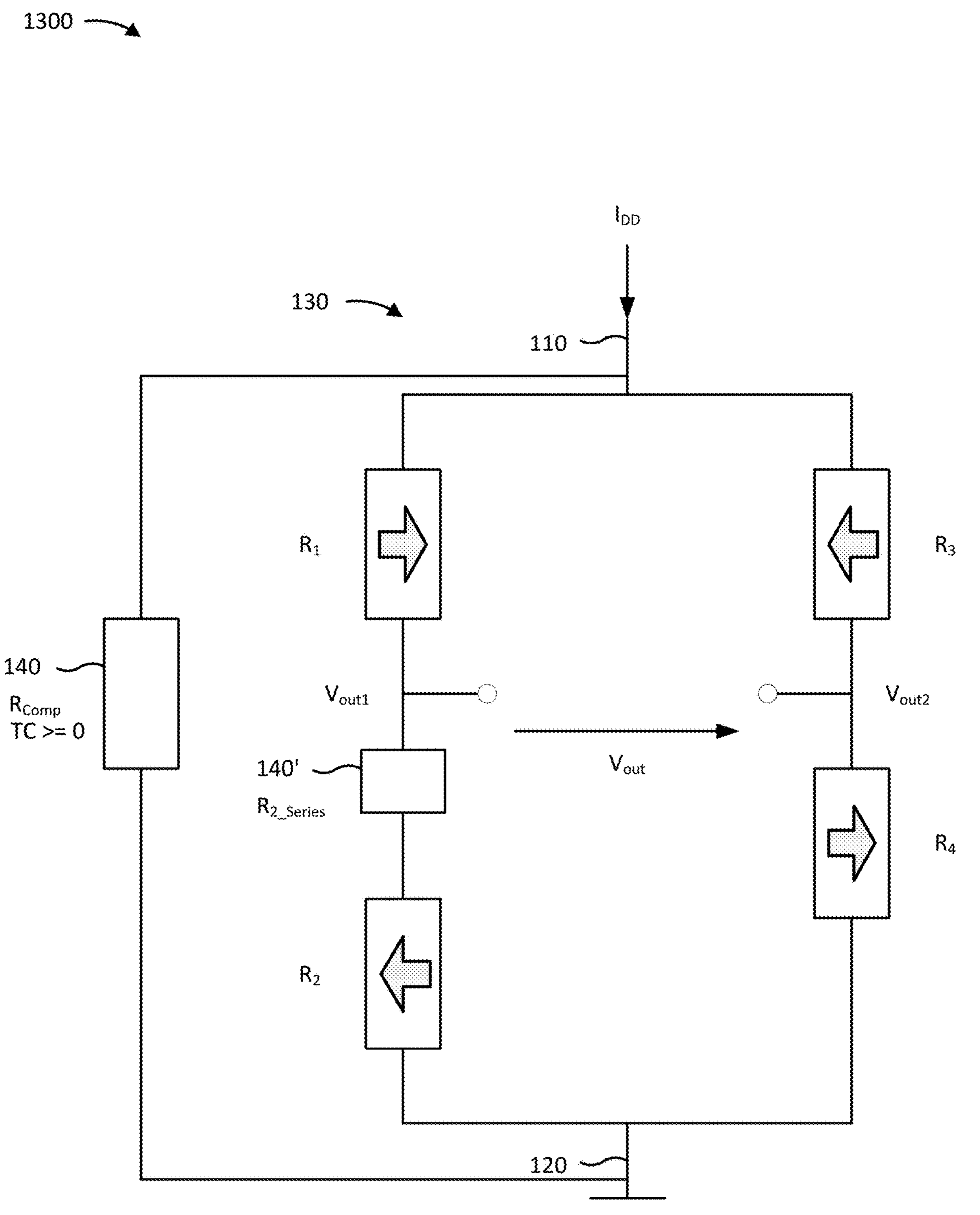
FIG. 13 shows a sensor circuit according to a further example implementation.

In general, there is a plurality of possibilities for the arrangement of the series or parallel resistors in the bridge circuit, in order to achieve the temperature compensation of sensitivity and offset. A combination of the example implementations described with reference to FIG. 3 and FIG. 11 is illustrated in FIG. 13, wherein the parallel-connected compensating resistor $R_{comp}$ is labeled with reference sign 140 and the series compensating resistor $R_{2,series}$ connected in the half bridge $R_1$, $R_2$ is labeled with reference sign 140'. Also, the example implementations described with reference to FIG. 8 and FIG. 11 can be combined with one another, so that a series circuit with a constant-voltage source, a ground connection 120 and a bridge circuit 130 is created, comprising at least one half bridge with a first and a second xMR resistor, which have a negative temperature coefficient in each case. The combined sensor circuit comprises at least one compensating resistor 140 with negative temperature coefficient which is less than the temperature coefficient of the first or second xMR resistor. The compensating resistor 140 is connected between the constant-voltage source and the bridge circuit 130 and the bridge circuit 130 is connected between the compensating resistor (140) and the ground connection. Alternatively, the compensating resistor 140 is connected between the bridge circuit 130 and the ground connection 120 and the bridge circuit 130 is connected between the constant-voltage source and the compensating resistor 140. A further compensating resistor $R_{2,series}$ is connected inside the half bridge ($R_1$, $R_2$) in series to the first and second xMR resistors $R_1$, $R_2$. The combined sensor circuit additionally has a second parallel half bridge ($R_3$, $R_3$) between the compensating resistor 140 and the ground connection 120.

Two further examples are shown in FIG. 14. In the circuit on the left, each bridge resistor $R_{11}$ to $R_{22}$ has a respectively allocated series compensating resistor. In the circuit on the right, each bridge resistor $R_{11}$ to $R_{22}$ has a respectively allocated parallel compensating resistor.

In semiconductor components, resistors with a positive temperature coefficient can be realized using materials such as metal or highly doped (poly) silicon. Resistors with a negative temperature coefficient can for example be achieved using less doped (poly) silicon.

The proposed sensor circuits having compensating resistors can achieve a more stable characteristic for the temperature without the costs and the additional space that would be required for active temperature compensation.

The aspects and features described in connection with a particular one of the previous examples may also be combined with one or more of the other examples to replace an identical or similar feature of this other example or to introduce the feature additionally into the other example.

Furthermore, it goes without saying that the disclosure of multiple steps, processes, operations or functions disclosed in the description or claims should not be interpreted as necessarily being in the described order, unless this is explicitly stated in the individual case or is mandatory for technical reasons. Therefore, the previous description does not restrict the execution of multiple steps or functions to a specific order. Furthermore, in other examples, a single step, a single function, a single process or a single operation may include and/or be broken into multiple substeps, subfunctions, subprocesses or suboperations.

If some aspects have been described in the preceding sections in connection with a device or system, these aspects are also to be understood as a description of the corresponding method. In this case, for example, a block, a device or a functional aspect of the device or the system may correspond to a feature, such as a method step, of the corresponding method. Correspondingly, aspects described in connection with a method are also to be understood as a description of a corresponding block, a corresponding element, a property or a functional feature of a corresponding device or of a corresponding system.

The following claims are hereby incorporated into the detailed description, each claim being independent as a separate example. It should also be noted that—although a dependent claim in the claims refers to a particular combination with one or more other claims—other examples may also comprise a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A sensor circuit, comprising a first connection;

a second connection;

a bridge circuit, which is connected between the first connection and the second connection, having a plurality of bridge resistors with respective temperature coefficients, wherein the bridge circuit has a measurement sensitivity with a temperature coefficient of measurement sensitivity and a bridge offset with a temperature coefficient of the bridge offset; and at least one compensating resistor, which is connected between the first connection and the second connection, configured with a temperature coefficient that differs from the respective temperature coefficients of the plurality of bridge resistors, wherein the temperature coefficient difference compensates for at least one of temperature-induced changes of the plurality of bridge resistors, or offset of the bridge circuit.

2. The sensor circuit as claimed in claim 1, wherein the at least one compensating resistor is measurement-variable-independent.

3. The sensor circuit as claimed in claim 1, wherein the at least one compensating resistor is connected between the first connection and the second connection and parallel to the bridge circuit.

4. The sensor circuit as claimed in claim 3, wherein a further compensating resistor is connected in the bridge circuit in series to a bridge resistor, of the plurality of bridge resistors.

5. The sensor circuit as claimed in claim 1, wherein the temperature coefficient of measurement sensitivity of the bridge circuit is negative, the respective temperature coefficients of the plurality of bridge resistors are negative and the temperature coefficient of the at least one compensating resistor is positive.

6. The sensor circuit as claimed in claim 1, wherein the temperature coefficient of measurement sensitivity of the bridge circuit is positive, the respective temperature coefficients of the plurality of bridge resistors are negative and the temperature coefficient of the at least one compensating resistor is less than the respective temperature coefficients of the plurality of bridge resistors.

7. The sensor circuit as claimed in claim 1, wherein the temperature coefficient of measurement sensitivity of the bridge circuit is negative, the respective temperature coefficients of the plurality of bridge resistors are positive and the temperature coefficient of the at least one compensating resistor is greater than the respective temperature coefficients of the plurality of bridge resistors.

8. The sensor circuit as claimed in claim 1, wherein the temperature coefficient of measurement sensitivity of the bridge circuit is positive, the respective temperature coefficients of the plurality of bridge resistors are positive and the temperature coefficient of the at least one compensating resistor is negative.

9. The sensor circuit as claimed in claim 1, wherein the at least one compensating resistor is connected in the bridge circuit in series to a bridge resistor of the plurality of bridge resistors.

10. The sensor circuit as claimed in claim 1, wherein the at least one compensating resistor is connected in series to the bridge circuit.

11. The sensor circuit as claimed in claim 10, wherein a further compensating resistor is connected in the bridge circuit in series to a bridge resistor of the plurality of bridge resistors.

12. The sensor circuit as claimed in claim 11, wherein the further compensating resistor is connected between an output signal connection of the bridge circuit and one of the first connection or the second connection.

13. The sensor circuit as claimed in claim 10, wherein the temperature coefficient of measurement sensitivity of the bridge circuit is negative and the at least one compensating resistor has a smaller temperature coefficient than the respective temperature coefficients of the plurality of bridge resistors.

14. The sensor circuit as claimed in claim 10, wherein the temperature coefficient of measurement sensitivity of the bridge circuit is positive and the at least one compensating resistor has a greater temperature coefficient than the respective temperature coefficients of the plurality of bridge resistors.

15. The sensor circuit as claimed in claim 1, wherein the bridge circuit has a first half bridge and a parallel second half bridge.

16. The sensor circuit as claimed in claim 1, wherein the plurality of bridge resistors of the bridge circuit are designed as xMR resistors.

17. The sensor circuit as claimed in claim 16, wherein the plurality of bridge resistors are designed as TMR resistors.

18. A sensor circuit, comprising:

a constant-current source;

a ground connection;

a bridge circuit, that is connected between the constant-current source and the ground connection, comprising at least one half bridge having a first xMR resistor and a second xMR resistor, which have a negative temperature coefficient in each case; and at least one compensating resistor with positive temperature coefficient, which is connected between the constant-current source and the ground connection and parallel to the bridge circuit, that differs from the respective temperature coefficients of a plurality of bridge resistors including the first xMR resistor and the second xMR resistor, wherein the temperature coefficient difference compensates for at least one of temperature-induced changes of the plurality of bridge resistors, or offset of the bridge circuit.

19. The sensor circuit as claimed in claim 18, wherein a further compensating resistor is connected in the half bridge in series to the first xMR resistor and the second xMR resistor, wherein the further compensating resistor has a temperature coefficient which differs from the negative temperature coefficient of the first xMR resistor and the second xMR resistor.

20. A sensor circuit, comprising:

a constant-voltage source;

a ground connection;

a bridge circuit comprising at least one half bridge having a first xMR resistor and a second xMR resistor which in each case have a negative temperature coefficient; and at least one compensating resistor with a negative temperature coefficient, that differs from the respective temperature coefficients of a plurality of bridge resistors including the first xMR resistor and the second xMR resistor, wherein the temperature coefficient difference compensates for at least one of temperature-induced changes of the plurality of bridge resistors, or offset of the bridge circuit, wherein the negative temperature coefficient of the at least one compensating resistor is smaller than the negative temperature coefficient of the first xMR resistor or the second xMR resistor, wherein the at least one compensating resistor is connected between the constant-voltage source and the bridge circuit and the bridge circuit is connected between the at least one compensating resistor and the ground connection, or wherein the at least one compensating resistor is connected between the bridge circuit and the ground connection and the bridge circuit is connected between the constant-voltage source and the at least one compensating resistor.

* * * * *